(12) United States Patent
Lee et al.

(10) Patent No.: US 12,382,591 B2
(45) Date of Patent: Aug. 5, 2025

(54) DISPLAY DEVICE

(71) Applicant: LG ELECTRONICS INC., Seoul (KR)

(72) Inventors: Junghun Lee, Seoul (KR); Kwangho Ko, Seoul (KR); Taegon Kim, Seoul (KR); Taewook Kim, Seoul (KR); Yoonsu Kim, Seoul (KR); Hyeonwoo Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 338 days.

(21) Appl. No.: 18/093,453

(22) Filed: Jan. 5, 2023

(65) Prior Publication Data

US 2023/0320002 A1     Oct. 5, 2023

(30) Foreign Application Priority Data

Apr. 1, 2022 (KR) .................. 10-2022-0041255

(51) Int. Cl.
*H05K 5/02* (2006.01)
*H10K 59/35* (2023.01)

(52) U.S. Cl.
CPC .............. *H05K 5/02* (2013.01); *H10K 59/35* (2023.02)

(58) Field of Classification Search
CPC ......... G02F 1/133314; G02F 1/133317; G02F 1/13332; G02F 1/133322; G02F 2201/503; H05K 5/02; H10K 59/35

USPC ......................................... 361/807
See application file for complete search history.

(56) References Cited

U.S. PATENT DOCUMENTS

| | | | |
|---|---|---|---|
| 10,170,898 B1* | 1/2019 | Chung | H05K 9/0049 |
| 2017/0292691 A1 | 10/2017 | Coo | |
| 2021/0263372 A1* | 8/2021 | Kang | G02F 1/133314 |
| 2021/0397036 A1* | 12/2021 | Guo | G02F 1/133317 |

FOREIGN PATENT DOCUMENTS

| | | |
|---|---|---|
| KR | 10-2017-0031943 A | 3/2017 |
| KR | 10-2018-0024713 A | 3/2018 |
| KR | 10-2021-0000108 A | 1/2021 |
| KR | 10-2292254 B1 | 8/2021 |

* cited by examiner

*Primary Examiner* — Timothy J Thompson
*Assistant Examiner* — Guillermo J Egoavil
(74) *Attorney, Agent, or Firm* — Birch, Stewart, Kolasch & Birch, LLP

(57) ABSTRACT

Disclosed is a display device. The display device of the present disclosure may include: a display panel; a plate disposed at a rear of the display panel, and coupled to the display panel; a frame disposed at a rear of the plate; and a mount plate disposed at a rear of the frame, wherein the plate may include a fixing part protruding rearward from a rear surface of the plate, passing through the frame, and coupled to the mount plate.

15 Claims, 26 Drawing Sheets

DISPLAY DEVICE

CROSS-REFERENCE TO RELATED APPLICATION

This application claims the priority benefit of Korean Patent Application No. 10-2022-0041255, filed on Apr. 1, 2022, the disclosure of which is incorporated herein by reference in its entirety.

BACKGROUND

1. Technical Field

The present disclosure relates to a display device.

2. Description of the Related Art

With the development of the information society, there have been growing demands for various types of display devices, and in order to meet these demands, various display devices, such as a liquid crystal display (LCD), a plasma display panel (PDP), an electroluminescent display (ELD), a vacuum fluorescent display (VFD), an organic light emitting diode (OLED), etc., have been studied and used recently.

Among them, the LCD panel includes a TFT substrate and a color filter substrate, which are positioned opposite each other with a liquid crystal layer interposed therebetween, and displays images by using light emitted from a backlight unit. Further, the OLED panel may display images by depositing a self light-emitting organic layer on a substrate, on which transparent electrodes are formed.

Many studies have been conducted recently on an ultra-thin display device.

SUMMARY

An object of the present disclosure is to solve the above and other problems.

Another object of the present disclosure may be to provide a display device including a plate and a mount plate which are coupled to each other with a frame interposed therebetween.

Another object of the present disclosure may be to provide a display device in which a portion of a frame as an injection molded product may partially form a rear surface of the display device.

Another object of the present disclosure may be to provide a display device capable of minimizing sagging of a plate coupled to a frame.

Another object of the present disclosure may be to provide a display device having an end cover and a back cover for covering a rear side of a mount plate.

In accordance with an aspect of the present disclosure for achieving the above and other objects, a display device may include: a display panel; a plate disposed at a rear of the display panel, and coupled to the display panel; a frame disposed at a rear of the plate; and a mount plate disposed at a rear of the frame, wherein the plate may include a fixing part protruding rearward from a rear surface of the plate, passing through the frame, and coupled to the mount plate.

BRIEF DESCRIPTION OF THE DRAWINGS

The above and other objects, features and advantages of the present invention will be more apparent from the following detailed description in conjunction with the accompanying drawings, in which.

DETAILED DESCRIPTION OF THE PREFERRED EMBODIMENTS

Figure 1:
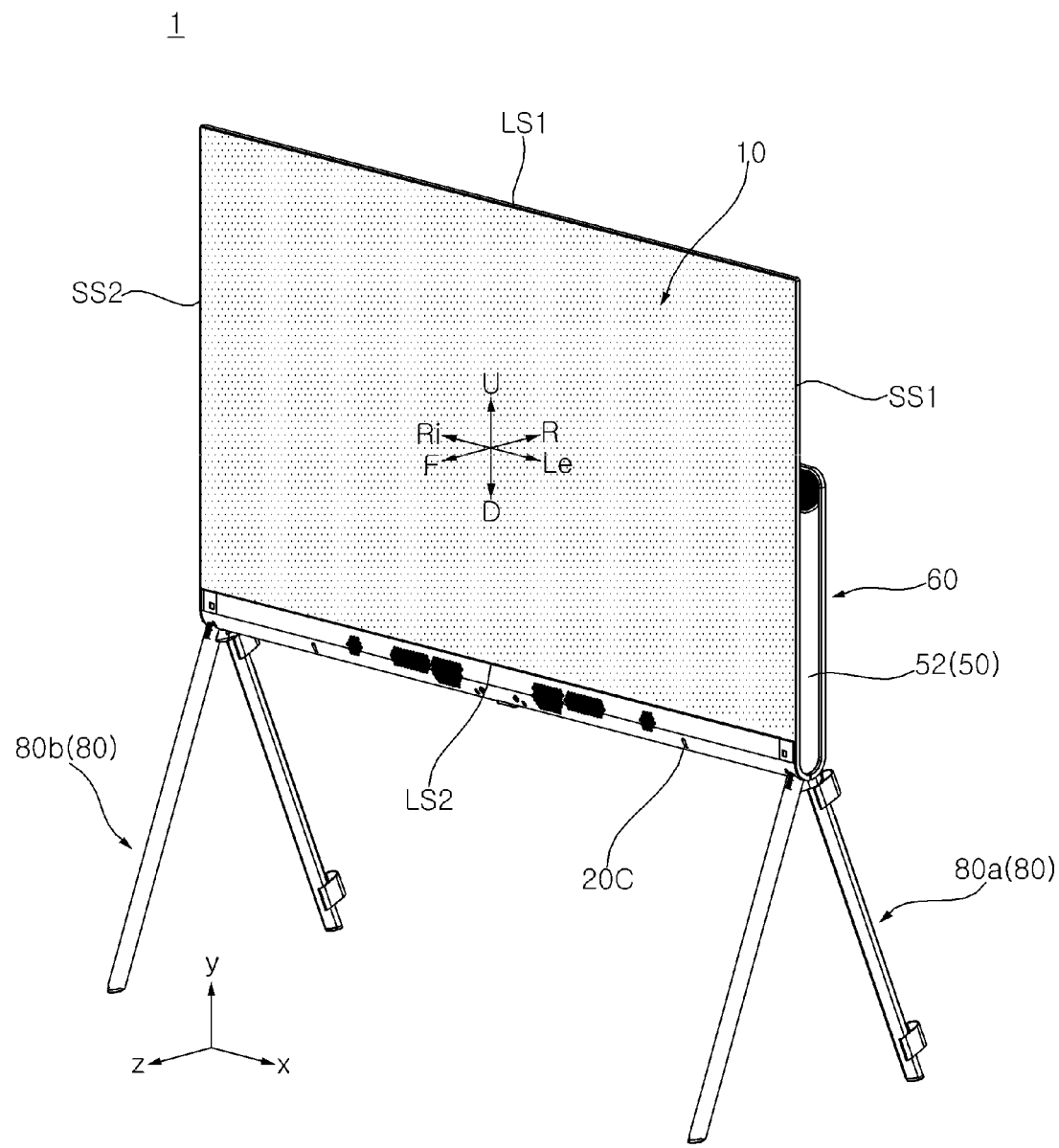
FIGS. 1 to 26 are diagrams illustrating examples of a display device according to embodiments of the present disclosure.

Hereinafter, the present disclosure will be described in detail with reference to the accompanying drawings, in which the same reference numerals are used throughout the drawings to designate the same or similar components, and a redundant description thereof will be omitted.

The terms "module" and "unit" for elements used in the following description are given simply in view of the ease of the description, and do not have a distinguishing meaning or role.

It will be noted that a detailed description of known arts will be omitted if it is determined that the detailed description of the known arts can obscure the embodiments of the invention. Further, the accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that, although the terms first, second, etc., may be used herein to describe various elements, these elements should not be limited by these terms. These terms are only used to distinguish one element from another.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As used herein, the singular forms are intended to include the plural forms as well, unless the context clearly indicates otherwise.

It should be understood that the terms "comprise", 'include", "have", etc. when used in this specification, specify the presence of stated features, integers, steps, operations, elements, components, or combinations of them but do not preclude the presence or addition of one or more other features, integers, steps, operations, elements, components, or combinations thereof.

In the embodiments illustrated in the Figures, representations of directions such as up (U), down (D), left (Le), right (Ri), front (F), and rear (R) are merely for convenience of explanation and the technical scope of the present disclosure is not limited thereto.

Referring to FIG. 1, a display device 1 may include a display panel 10. The display panel 10 may display images.

The display panel 10 may include a first long side LS1, a second long side LS2 opposite to the first long side LS1, a first short side SS1 adjacent to the first long side LS1 and the second long side LS2, and a second short side SS2 opposite to the first short side SS1. For convenience of explanation, it is illustrated and described that the first and second long sides LS1 and LS2 are longer than the first and second short sides SS1 and SS2, but there may also be a case in which lengths of the first and second long sides LS1 and LS2 may be approximately equal to lengths of the first and second short sides SS1 and SS2.

A direction parallel to the first and second short sides SS1 and SS2 of the display panel 10 may be referred to as an up-down direction. A direction parallel to the first and second long sides LS1 and LS2 of the display panel 10 may be referred to as a left-right direction. A direction perpendicular to the long sides LS1 and LS2 and the short sides SS1 and SS2 of the display panel 10 may be referred to as a front-rear direction.

A side on which the display panel 10 displays an image may be referred to as a front side F, z, and a side opposite thereto may be referred to as a rear side R. The first short side SS1 may be referred to as a left side Le, x and the second short side SS2 may be referred to as a right side Ri. The first long side LS1 may be referred to as an upper side U, y and the second ling side LS2 may be referred to as a lower side D.

In the following description, a display panel using an Organic Light Emitting Diode (OLED) will be described as an example, but the display panel which may be applied to the present disclosure is not limited thereto.

Figure 2:
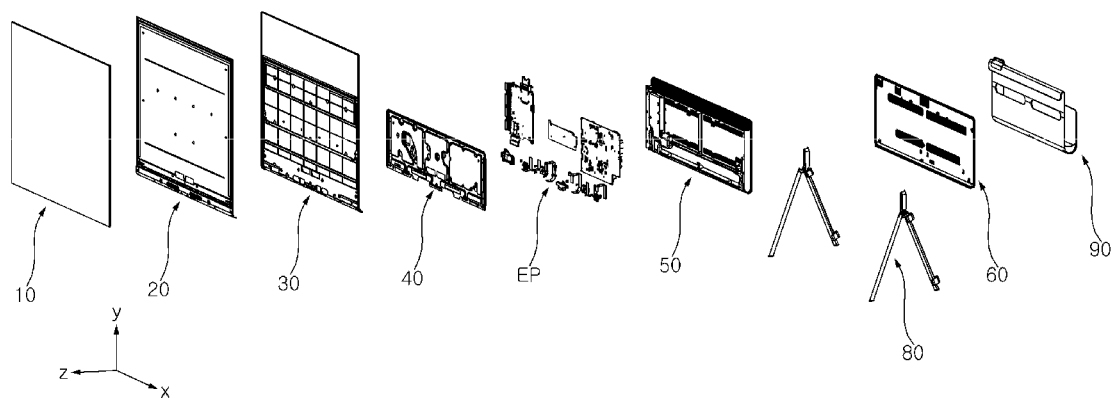

Referring to FIGS. 1 and 2, the display device 1 may include the display panel 10, a plate 20, a frame 30, a mount plate 40, electronic parts EP, a back cover 50, an end cover 60, a stand 80, and a basket 90.

The display panel 10 may divide the image into a plurality of pixels and may output the image while controlling color, brightness, and chroma of the respective pixels. The display panel 10 may be divided into an active area, in which the image is displayed, and a de-active area in which the image is not displayed. The display panel 10 may generate light corresponding to red, green, or blue color in response to a control signal.

The plate 20 may be disposed at the rear of the display panel 10 and may be coupled to the display panel 10. The plate 20 may include a metal material. For example, the plate 20 may be hot dipped galvanized iron (GI) or electrolytic galvanized iron (EGI). The plate 20 may be referred to as an inner plate.

The frame 30 may be disposed at the rear of the plate 20 and may be coupled to the plate 20. The frame 30 may be an injection molded product. For example, the frame 30 may include a plastic material. The frame 30 may be referred to as a main frame, a module cover, or a cover bottom.

The mount plate 40 may be disposed at the rear of the frame 30 and may be coupled to the frame 30. The mount plate 40 may include a metal plate. The mount plate 40 may be referred to a fixing plate or a PCB plate.

The electronic parts EP may be disposed at the rear of the mount plate 40 and may be mounted on the mount plate 40.

The back cover 50 may be disposed at the rear of the mount plate 40 and the electronic parts EP and may be coupled to the mount plate 40. The back cover 50 may cover the rear side of the mount plate 40 and the electronic parts EP. The back cover 50 may be an injection molded product. For example, the back cover 50 may include a plastic material.

The end cover 60 may be disposed at the rear of the back cover 50 and may be coupled to the back cover 50. A rear surface of the back cover 50 may be covered by the end cover 60. The end cover 60 may be an injection molded product. For example, the end cover 60 may include a plastic material.

The stand 80 may be disposed between the back cover 50 and the end cover 60 and may be coupled to the back cover 50. The stand 80 allows the back cover 50 to be upwardly spaced apart from the ground. The basket 90 may be disposed at the rear of the end cover 60 and may be hung on an upper end of the end cover 60.

Figure 3:
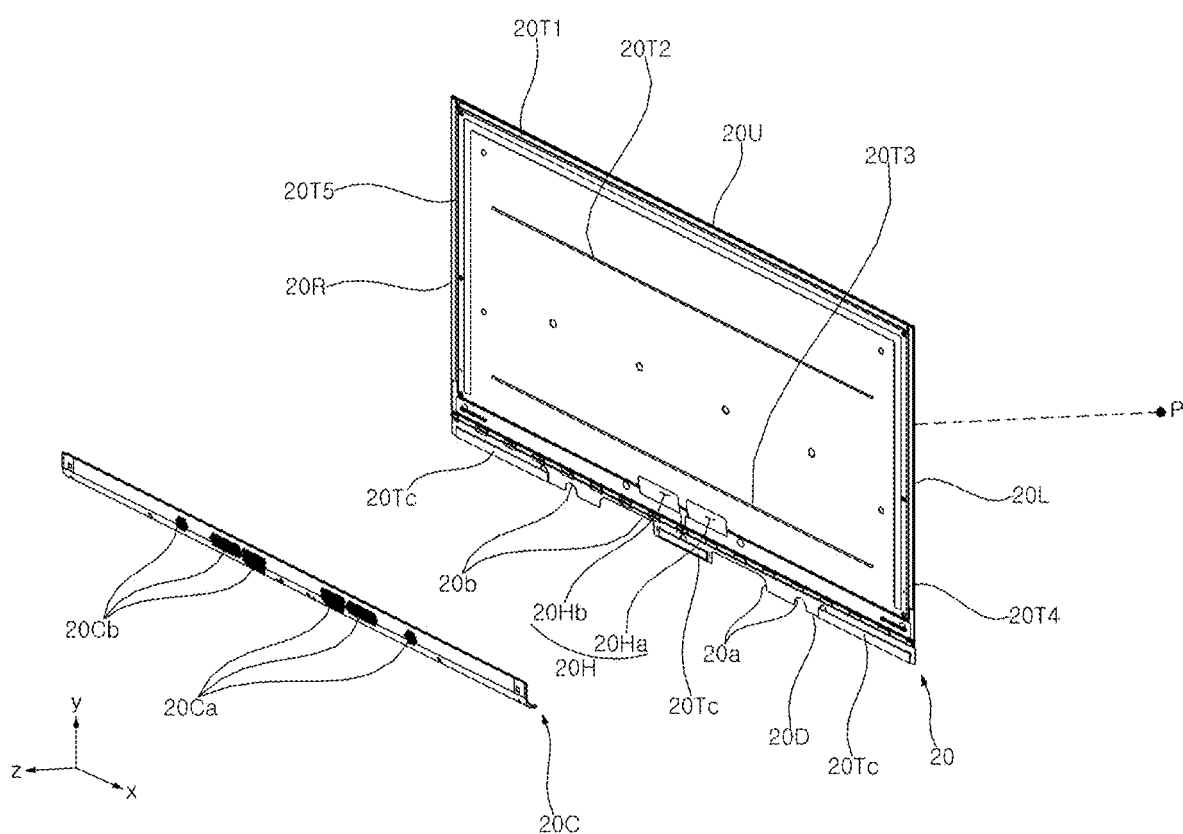
Figure 4:
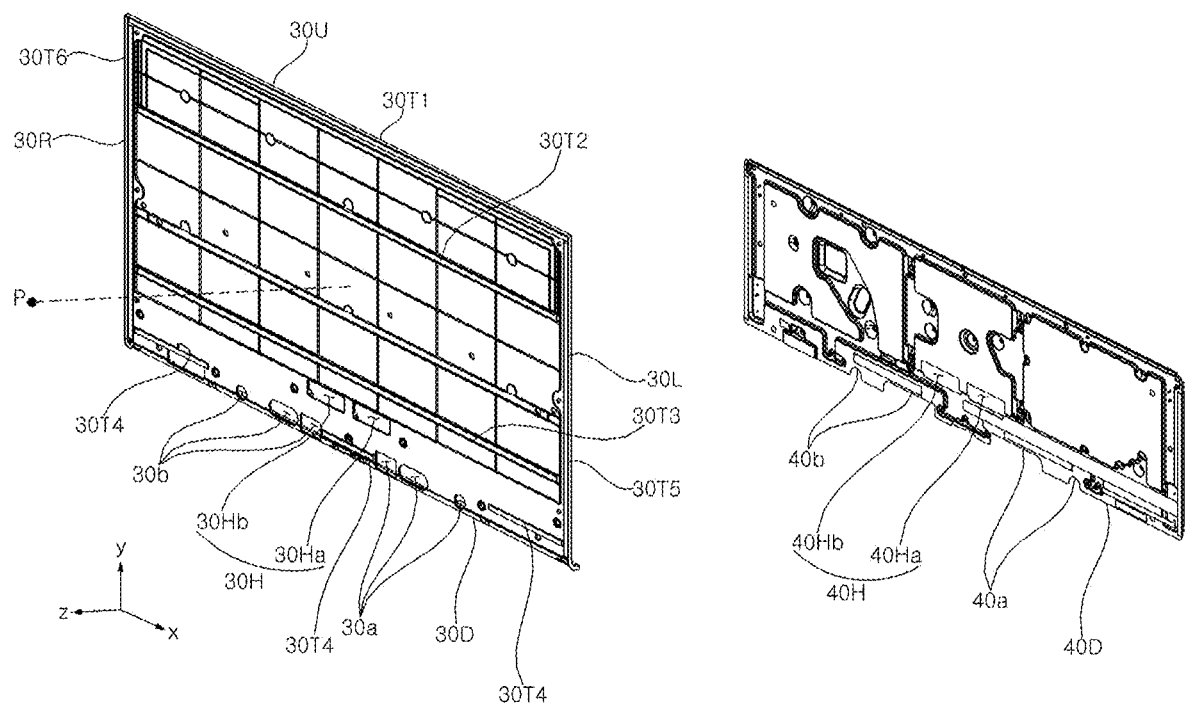

Referring to FIGS. 3 and 4, a size of the frame 30 may correspond to a size of the plate 20. The size of the frame 30 may be greater than the size of the plate 20, and edges 30U, 30D, 30L, and 30R of the frame 30 may be disposed outside of edges 20U, 20D, 20L, and 20R of the frame 20. A size of the mount plate 40 may be smaller than the size of the frame 30. Alternatively, the size of the mount plate 40 may correspond to the size of the frame 30.

A first cable hole 20H may be adjacent to a bottom side 20D of the plate 20, and may be formed by passing through the plate 20 in a front-rear direction. The first cable hole 20H may include a first left cable hole 20Ha and a first right cable hole 20Hb which are spaced apart from each other along the bottom side 20D.

First speaker holes 20a and 20b may be formed in a direction from the bottom side 20D of the plate 20 toward the inside of the plate 20. The first speaker holes 20a and 20b may be formed by partially cutting out the bottom side 20D of the plate 20. The first speaker holes 20a and 20b may include first left speaker holes 20a and first right cable holes 20b which are spaced apart from each other along the bottom side 20D.

A second cable hole 30H may be adjacent to a bottom side 30D of the frame 30 and may be formed by passing through the frame 30 in the front-rear direction. The second cable hole 30H may include a second left cable hole 30Ha and a second right cable hole 30Hb which are spaced apart from each other along the bottom side 30D.

Second speaker holes 30a and 30b may be disposed between the bottom side 30D of the frame 30 and the second cable hole 30H, and may be formed by passing through the frame 30 in the front-rear direction. The second speaker holes 30a and 30b may include second left speaker holes 30a and second right speaker holes 30b which are spaced apart from each other along the bottom side 30D.

A third cable hole 40H may be adjacent to a bottom side 40D of the mount plate 40 and may be formed by passing through the mount plate 40 in the front-rear direction. The third cable hole 40H may include a third left cable hole 40Ha and a third right cable hole 40Hb which are spaced apart from each other along the bottom side 40D.

Third speaker holes 40a and 40b may be formed in a direction from the bottom side 40D of the mount plate 40 toward the inside of the mount plate 40. The third speaker holes 40a and 40b may be formed by partially cutting out the bottom side 40D of the mount plate 40. The third speaker holes 40a and 40b may include third left speaker holes 40a and third right speaker holes 40b which are spaced apart from each other along the bottom side 40D.

In the front-rear direction, the first cable hole 20H may be aligned with the second cable hole 30H and the third cable hole 40H. In the front-rear direction, the first speaker holes 20a and 20b may be aligned with the second speaker holes 30a and 30b and the third speaker holes 40a and 40b.

Meanwhile, a front cover 20C may be adjacent to the bottom side 20D of the plate 20 and may extend along the bottom side 20D. The front cover 20C may be disposed opposite the frame 30 with respect to the plate 20. Fourth speaker holes 20Ca and 20Cb may be formed in the front cover 20C. In the front-rear direction, the fourth speaker holes 20Ca and 20Cb may be aligned with the first speaker holes 20a and 20b. For example, the front cover 20C may include a plastic material. In addition, the front cover 20C may include a fabric material.

Figure 5:
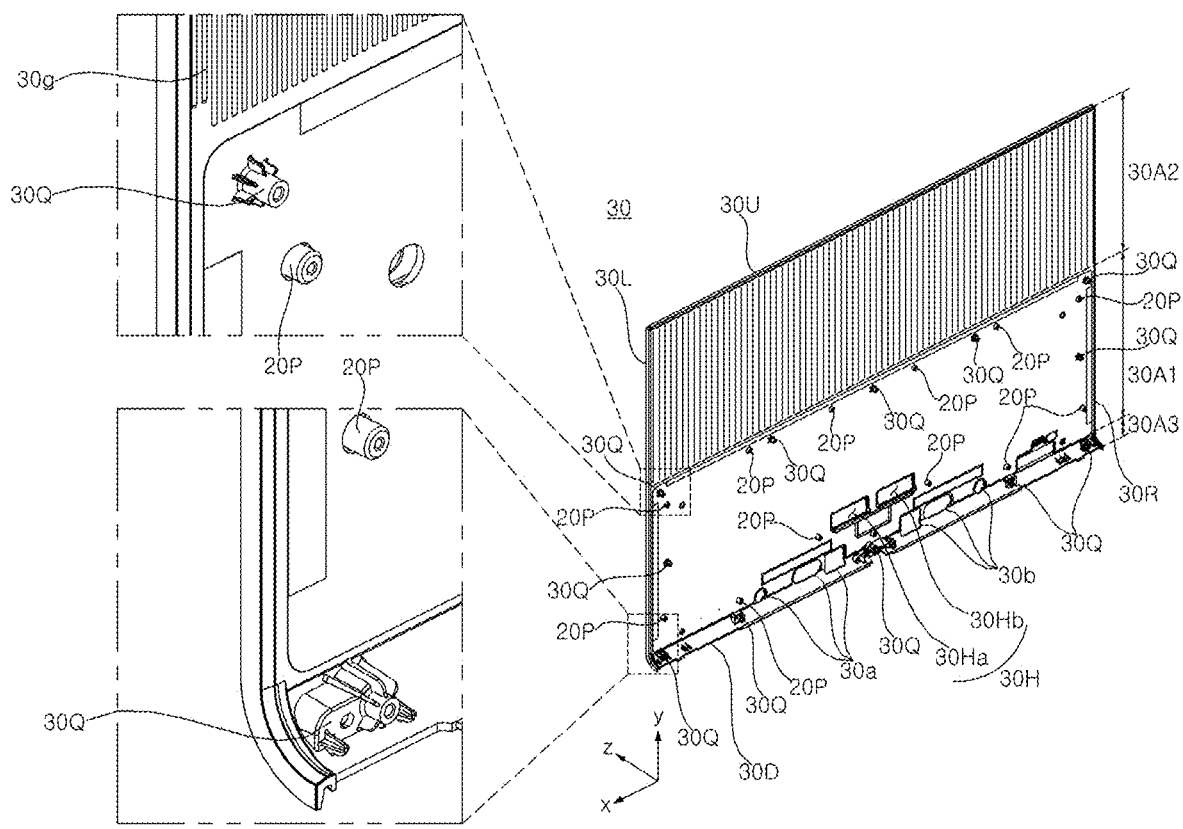

Referring to FIGS. 3 to 5, a plurality of adhesive members 30T1, 30T2, 30T3, 30T4, 30T5, and 30T6 may be coupled or attached to a front surface of the frame 30.

Horizontal adhesive members 30T1, 30T2, 30T3, and 30T4 may extend in a left-right direction, i.e., horizontal direction. A first horizontal adhesive member 30T1 may be adjacent to an upper side 30U of the frame 30. A second horizontal adhesive member 30T2 may be downwardly spaced apart from the first horizontal adhesive member 30T1, and may be disposed closer to the upper side 30U than to the bottom side 30D of the frame 30. A third horizontal adhesive member 30T3 may be downwardly spaced apart from the second horizontal adhesive member 30T2, and may be disposed closer to the bottom side 30D than to the upper side 30U of the frame 30. A fourth horizontal adhesive member 30T4 may be adjacent to the bottom side 30D of the frame 30. A plurality of fourth horizontal adhesive members 30T4 may be spaced apart from each other along the bottom side 30D.

Vertical adhesive members 30T5 and 30T6 may extend in an up-down direction, i.e., vertical direction. The first vertical adhesive member 30T5 may be adjacent to the left side 30L of the frame 30. The second vertical adhesive member 30T6 may be adjacent to the right side 30R of the frame 30.

The plurality of adhesive members 30T1, 30T2, 30T3, 30T4, 30T5, and 30T6 may be disposed between the plate 20 and the frame 30, and may be coupled or adhered to the rear surface of the plate 20 and the front surface of the frame 30. For example, the plurality of adhesive members 30T1, 30T2, 30T3, 30T4, 30T5, and 30T6 may be double-sided tapes, thereby allowing the frame 30 to be coupled to the plate 20.

Meanwhile, the frame 30 may include a first part 30A1, a second part 30A2, and a third part 30A3. The first part 30A1 and the second part 30A2 may be collectively referred to as flat portions, and the third part 30A3 may be referred to as a curved portion.

The first part 30A1 may be generally flat and may have the second cable hole 30H.

The second part 30A2 may be a portion of the frame 30 that is positioned above the first part 30A1. In the vertical direction, a length of the second part 30A2 may be equal or similar to a length of the first part 30A1. A pattern 30g may be formed on a rear surface of the second part 30A2. For example, the pattern 30g may be embossed vertical stripes.

The third part 30A3 may be a portion of the frame 30 that is positioned below the first part 30A1. For example, the third part 30A3 may be curved rearwardly from a lower end of the first part 30A1. In the vertical direction, a length of the third part 30A3 may be smaller than the length of the first part 30A1. The bottom side 20D (see FIG. 3) of the plate 20 may be disposed at a boundary between the first part 30A1 and the third part 30A3 or may be disposed thereon.

Fixing parts 20P may protrude rearward from the rear surface of the plate 20 and may pass through the first part 30A1 of the frame 30. A plurality of fixing parts 20P may be spaced apart from each other. For example, the plurality of fixing parts 20P may be arranged along a perimeter of the first part 30A1. For example, the fixing parts 20P may be press-fit into the plate 20. Alternatively, the fixing parts 20P and the plate 20 may be integrally formed as one body. The fixing parts 20P may be referred to as PEM nuts.

Coupling parts 30Q may protrude rearward from a rear surface of the first part 30A1 and a rear surface of the third part 30A3, and may be spaced apart from the fixing parts 20P. Ribs (not shown) may be formed on an outer perimeter of the coupling parts 30Q. A plurality of coupling parts 30Q may be arranged along the perimeter of the first part 30A1 and the third part 30A3. For example, the coupling parts 30Q and the frame 30 may be integrally formed as one body. Alternatively, the coupling parts 30Q may be press-fit into the frame 30. The coupling parts 30Q may be referred to as PEM nuts.

Figure 6:
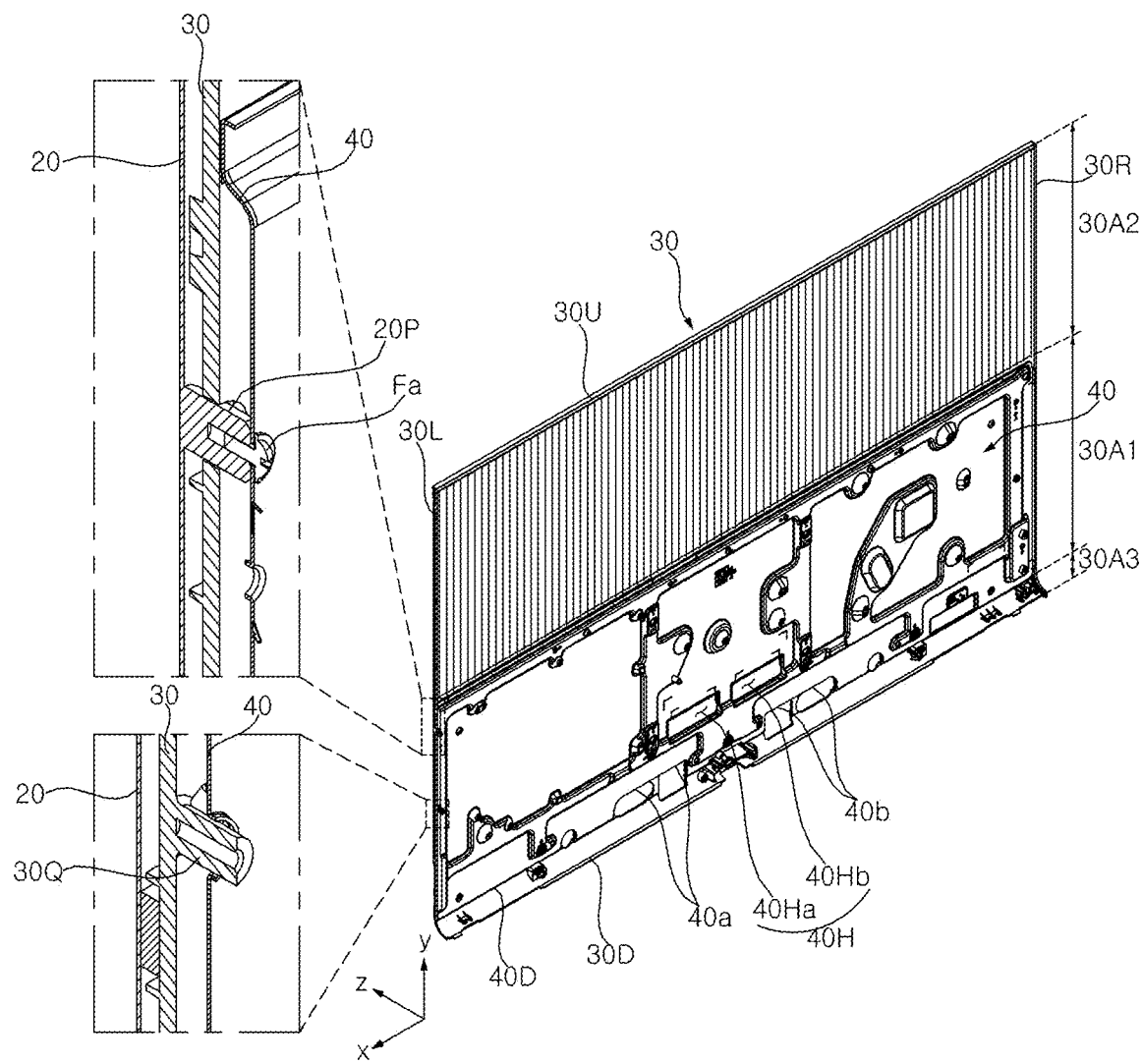
Figure 7:
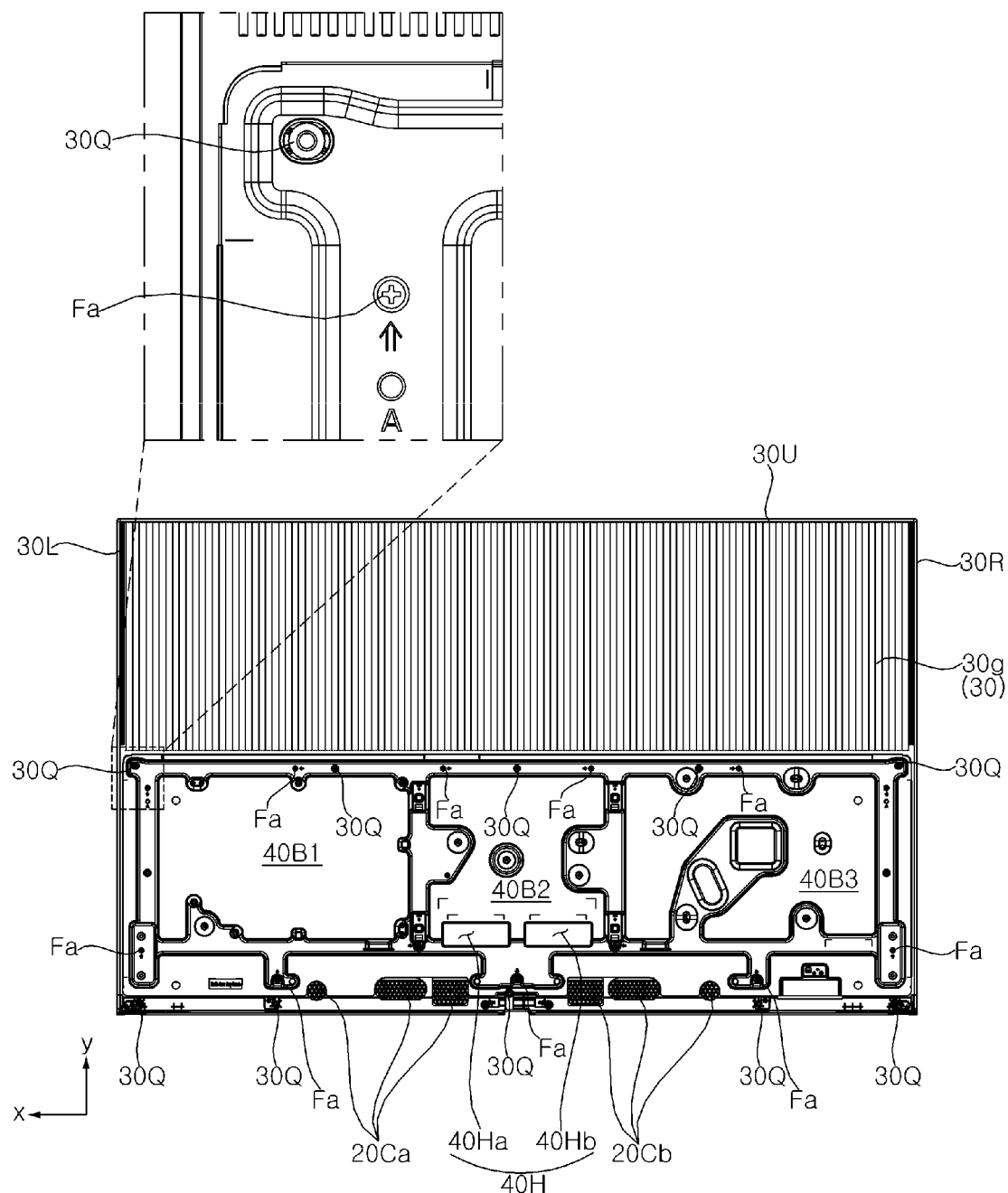

Referring to FIGS. 6 and 7, the mount plate 40 may be disposed at the rear of the first part 30A1 of the frame 30. A size of the mount plate 40 may correspond to a size of the first part 30A1. That is, the second part 30A2 of the frame 30 may not be covered by the mount plate 40.

The fixing parts 20P may protrude from the rear surface of the plate 20 toward the mount plate 40, and may be aligned with a hole (not shown) formed in the mount plate 40. A fastening member Fa, such as a screw, may be fastened to the fixing part 20P through the hole of the mount plate 4. A plurality of fastening members Fa may be fastened to the plurality of fixing parts 20P (see FIG. 5). That is, the mount plate 40 may be coupled to the plate 20. Accordingly, the frame 30 may be coupled to the plate 20 and the mount plate 40 at a position between the plate 20 and the mount plate 40.

Meanwhile, the coupling parts 30Q may protrude from the frame 30 toward the mount plate 40, and may pass through the mount plate 40. The ribs (see FIG. 5) of the coupling parts 30Q may come into contact with the front surface of the mount plate 40, and may minimize sagging of the frame 30 toward the plate 40. A plurality of holes (not shown) may be formed in the mount plate 40, and the plurality of coupling parts 30Q may pass through the holes.

Figure 8:
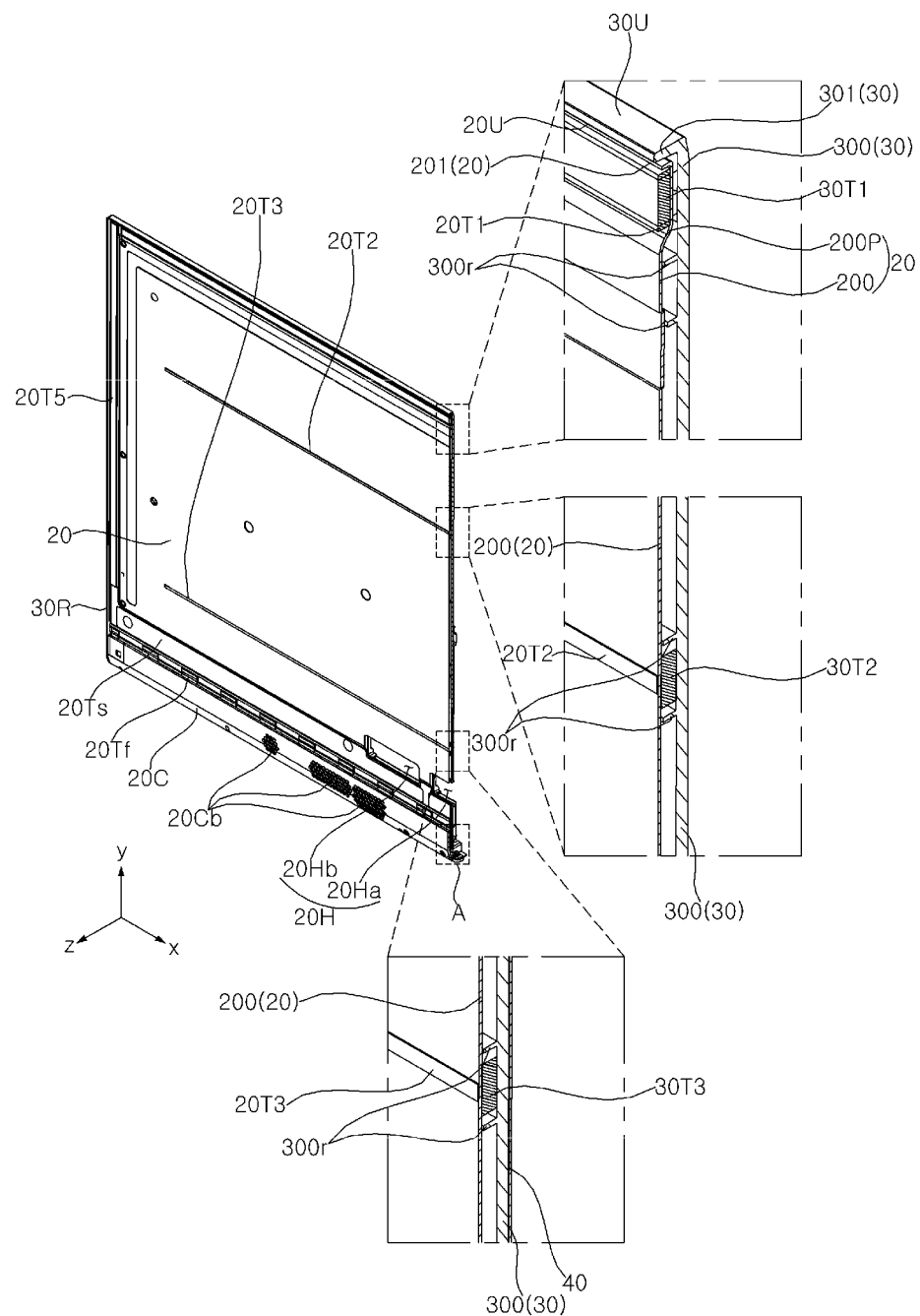

Referring to FIG. 8, a plurality of ribs 300r may protrude from the front surface of the frame 30 toward the rear surface of the plate 20, and may be spaced apart from the plurality of adhesive members 30T1, 30T2, 30T3, 30T4, 30T5, and 30T6. The plurality of ribs 300r may support the rear surface of the plate 20. Accordingly, the plurality of ribs 300r may minimize sagging of the plate 20 in regions other than the plurality of adhesive members 30T1, 30T2, 30T3, 30T4, 30T5, and 30T6.

A pressed portion 200P of the plate 20 may be disposed on a perimeter of a flat plate portion 200 of the plate 20, and may be pressed rearward from the front surface of flat plate portion 200. That is, the pressed portion 200P may be lowered to the rear with respect to the flat plate portion 200 to form a step. A bending portion 201 of the plate 20 may be bent forwardly from an end of the pressed portion 200P, and may form the upper side 20U, the left side 20L (see FIG. 3), or the right side 20R of the plate 20.

A bending portion 301 of the frame 30 may be bent forwardly from the perimeter of the flat plate portion 300 of the frame 30, and may form the upper side 30U, the left side 30L (see FIG. 4), and the right side 30R. The edges 30U, 30D, 30L, and 30R of the frame 30 may be disposed on the outside of the edges 20U, 20D, 20L, and 20R of the plate 20.

Figure 9:
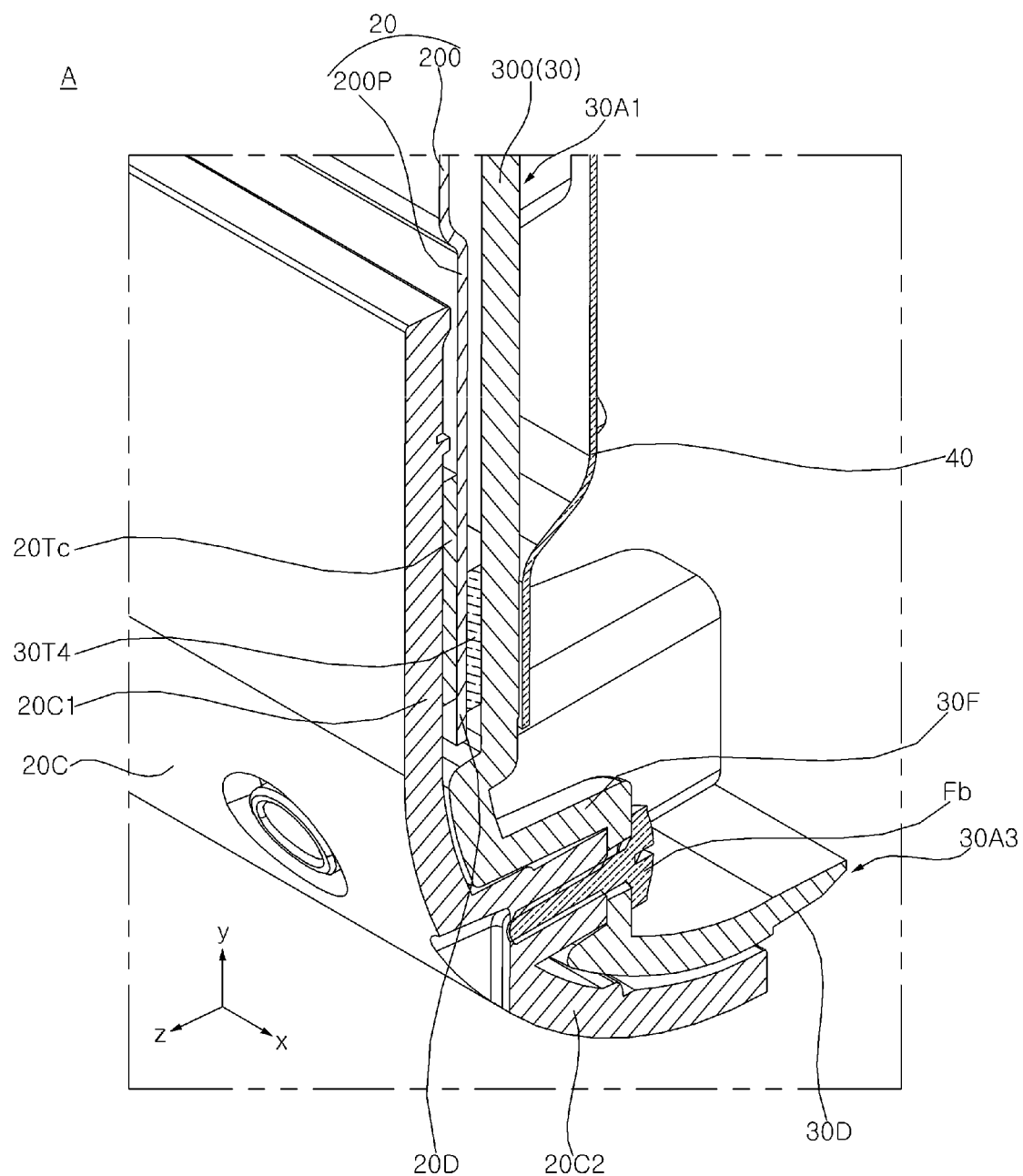

Referring to FIG. 9, the front cover 20C may include a flat portion 20C1 and a curved portion 20C2. The flat portion 20C1 may be disposed in front of the pressed portion 200P of the plate 20, and may extend along the bottom side 20D of the plate 20. The curved portion 20C2 may extend along a lower end of the flat portion 20C1, and may be curved along the third part 30A3 of the frame 30.

An adhesive member 20Tc may be adjacent to the bottom side 20D of the plate 20. The adhesive member 20Tc may be coupled or attached to the front surface of the pressed portion 200P of the plate 20. The fourth horizontal adhesive member 30T4 may be coupled or attached to the rear surface of the pressed portion 200P, and may be disposed opposite the adhesive member 20Tc with respect to the pressed portion 200P.

A plurality of adhesive members 20Tc may be spaced apart from each other with the first speaker holes 20a and 20b disposed therebetween (see FIG. 3). The plurality of adhesive members 20Tc may be disposed between the front cover 20C and the plat 20, and may be coupled or attached to the rear surface of the flat portion 20C1 and the front surface of the pressed portion 200P. For example, the plurality of adhesive members 20Tc may be double-sided tapes, thereby allowing the front cover 20C to be coupled to the plate 20.

A bottom fixing part 30F may be recessed rearwardly from a front surface of the third part 30A3 of the frame 30, and a portion of the curved portion 20C2 of the front cover 20C may be inserted into the bottom fixed part 30F. A fastening member Fb, such as a screw, may be fastened to the portion of the curved portion 20C2 by the bottom fixing part 30F, thereby allowing the front cover 20C to be coupled to the frame 30.

Figure 10:
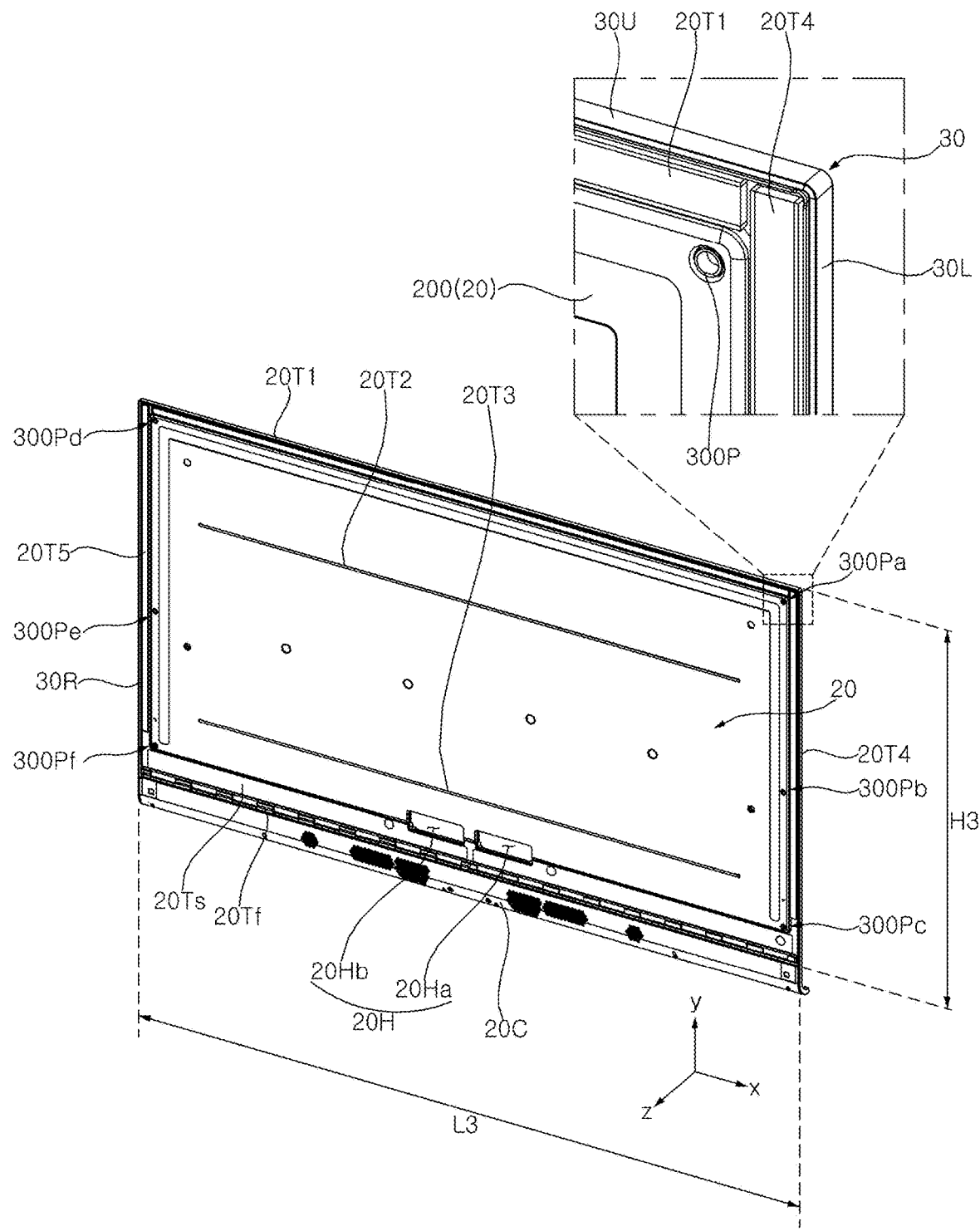

Referring to FIG. 10, a horizontal length L3 of the frame 30 (or length in the left-right direction) may be greater than a vertical length H3 of the frame 30 (or length in the up-down direction). A pin 300P may protrude forward from the front surface of the frame 30 and may pass through the plate 20. A pin hole (not shown) may be formed in the flat plate portion 200 of the plate 20, and the pin 300P may be inserted into the pin hole. A diameter of the pin hole may be equal to or greater than a diameter of the pin 300P.

A plurality of pins 300P may be vertically spaced apart from each other. First pins 300Pa, 300Pb, and 300Pc may be adjacent to the left side 30L of the frame 30 and may be vertically spaced apart from each other. A first upper pin 300Pa may be adjacent to the upper side 30U of the frame 30; a first middle pin 300Pb may be downwardly spaced apart from the first upper pin 300Pa; and a first lower pin 300Pc may be disposed opposite the first upper pin 300Pa with respect to the first middle pin 300Pb. Second pins 300Pd, 300Pe, and 300Pf may be adjacent to the right side 30R of the frame 30, and may be vertically spaced apart from each other. A second upper pin 300Pd may be adjacent to the upper side 30U of the frame 30; a second middle pin 300Pe may be downwardly spaced apart from the second upper pin 300Pb; and a second lower pin 300Pf may be disposed opposite the second upper pin 300Pd with respect to the second middle pin 300Pe.

Accordingly, the frame 30 may be restrained to the plate 20 by the pin 300P, thereby minimizing thermal deformation.

Figure 11:
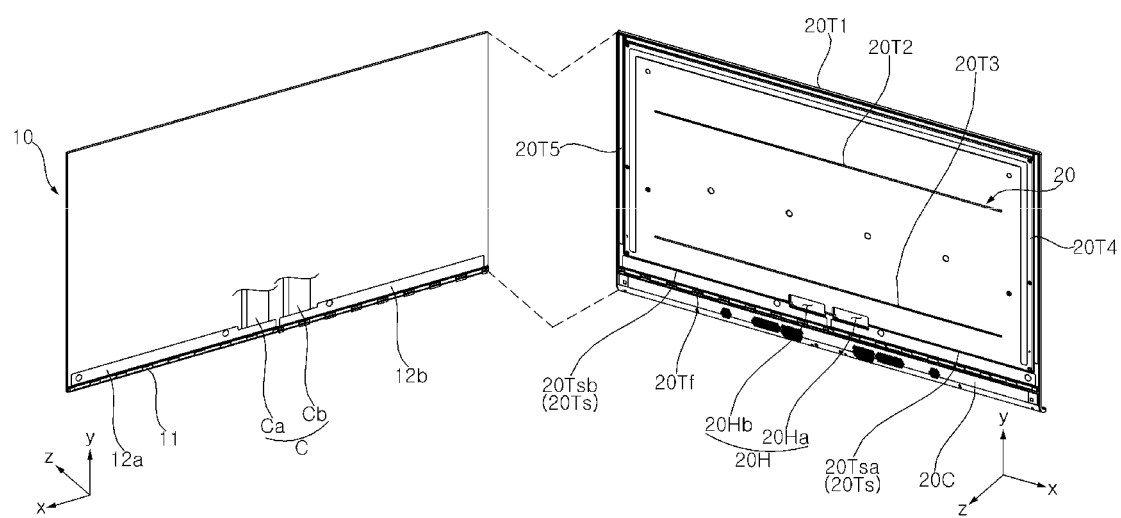

Referring to FIGS. 8 and 11, a plurality of adhesive members 20T1, 20T2, 20T3, 20T4, and 20T5 may be coupled or attached to the front surface of the plate 20.

Horizontal adhesive members 20T1, 20T2, and 20T3 may extend in the left-right direction, i.e., horizontal direction. A first horizontal adhesive member 20T1 may be adjacent to the upper side 20U of the plate 20. A second horizontal adhesive member 20T2 may be downwardly spaced apart from the first horizontal adhesive member 20T1, and may be disposed opposite the second horizontal adhesive member 30T2 with respect to the plate 20. A third horizontal adhesive member 20T3 may be downwardly spaced apart from the second horizontal adhesive member 20T2, and may be disposed opposite the third horizontal adhesive member 30T3 with respect to the plate 20.

Vertical adhesive members 20T4 and 20T5 (see FIG. 3) may extend in the up-down direction, i.e., vertical direction. A first vertical adhesive member 20T4 may be adjacent to the left side 20L of the plate 20. A second vertical adhesive member 20T5 may be adjacent to the right side 20R of the plate 20.

The first horizontal adhesive member 20T1 may be disposed between the flat plate portion 200 and the upper side 20U of the plate 20, and may be coupled or attached to the front surface of the pressed portion 200P. The first horizontal adhesive member 30T1 may be disposed opposite the first horizontal adhesive member 20T1 with respect to the pressed portion 200P, and may be coupled or attached to the rear surface of the pressed portion 200P.

The first vertical adhesive member 20T4 may be disposed between the flat plate portion 200 and the left side 20L of the plate 20, and may be coupled or attached to the front surface of the pressed portion 200P. The first vertical adhesive member 30T5 may be disposed opposite the first vertical adhesive member 20T4 with respect to the pressed portion 200P, and may be coupled or attached to the rear surface of the pressed portion 200P.

The second vertical adhesive member 20T5 may be disposed between the flat plate portion 200 and the right side 20R of the plate 20, and may be coupled or attached to the front surface of the pressed portion 200P. The second vertical adhesive member 30T6 may be disposed opposite the second vertical adhesive member 20T5 with respect to the pressed portion 200P, and may be coupled or attached to the rear surface of the pressed portion 200P.

Accordingly, it is possible to minimize an increase in thickness of the display device, which increases due to the adhesive members 20T1, 30T1, 20T4, 30T5, 20T5, and 30T6.

The display panel 10 may be disposed at the front of the plate 20. The plurality of adhesive members 20T1, 20T2, 20T3, 20T4, and 20T5 may be disposed between the display panel 10 and the plate 20, and may be coupled or attached to the rear surface of the display panel 10 and the front surface of the plate 20. For example, the plurality of adhesive members 20T1, 20T2, 20T3, 20T4, and 20T5 may be double-sided tapes, thereby allowing the display pane 110 to be coupled to the plate 20. In this case, the display panel 10 may be disposed in parallel with the plate 20.

A lower adhesive member 20Tf may be disposed on the front cover 20C and may be coupled or attached to the front surface of the plate 20. A plurality of lower adhesive members 20Tf may be spaced apart from each other along the front cover 20C. The lower adhesive member 20Tf may be referred to as a cable adhesive member.

Upper adhesive member 20Ts may be disposed between the lower adhesive member 20Tf and the first cable holes 20H, and may be coupled or attached to the front surface of the plate 20. A first upper adhesive member 20Tsa may extend toward the left side of the plate 20 from a portion of the plate 20 which is adjacent to the first left cable hole 20Ha. A second upper adhesive member 20Tsb may extend toward the right side of the plate 20 from a portion of the plate 20 which is adjacent to the first right cable hole 20Hb. The upper adhesive member 20Ts may be referred to as a substrate adhesive member.

Source PCBs 12a and 12b may be adjacent to the bottom side of the display panel 10 and may extend along the bottom side. In the front-rear direction, a first source PCB 12a may be aligned with the first upper adhesive member 20Tsa, and a second source PCB 12b may be aligned with the second upper adhesive member 20Tsb.

A source chip on film (COF) 11 may be disposed between the bottom side of the display panel 10 and the source PCBs 12a and 12b, and may be electrically connected to the display panel 10 and the source PCBs 12a and 12b. In the front-rear direction, a plurality of source COFs 11 may be aligned with the plurality of lower adhesive members 20Tf.

Cables C, such as a flexible flat cable (FFC), may be electrically connected to the source PCBs 12a and 12b. A first cable Ca may be electrically connected to the first source PCB 12a, and may pass through the first left cable hole 20Ha to extend rearwardly of the frame 30. A second cable Cb may be electrically connected to the second source PCB 12b, and may pass through the first right cable hole 20Hb to extend rearwardly of the frame 30.

The lower adhesive member 20Tf may be disposed between the source COF 11 and the plate 20, and may be coupled or attached to the source COF 11 and the plate 20. The upper adhesive members 20Tsa and 20Tsb may be disposed between the source PCBs 12a and 12b and the plate 20, and may be coupled or attached to the source PCBs 12a and 12b and the plate 20. For example, the lower adhesive member 20Tf and the upper adhesive member 20Tsa and 20Tsb may be double-sided tapes, thereby allowing the source COF 11 and the source PCBs 12a and 12b to be coupled to the plate 20.

Figure 12:
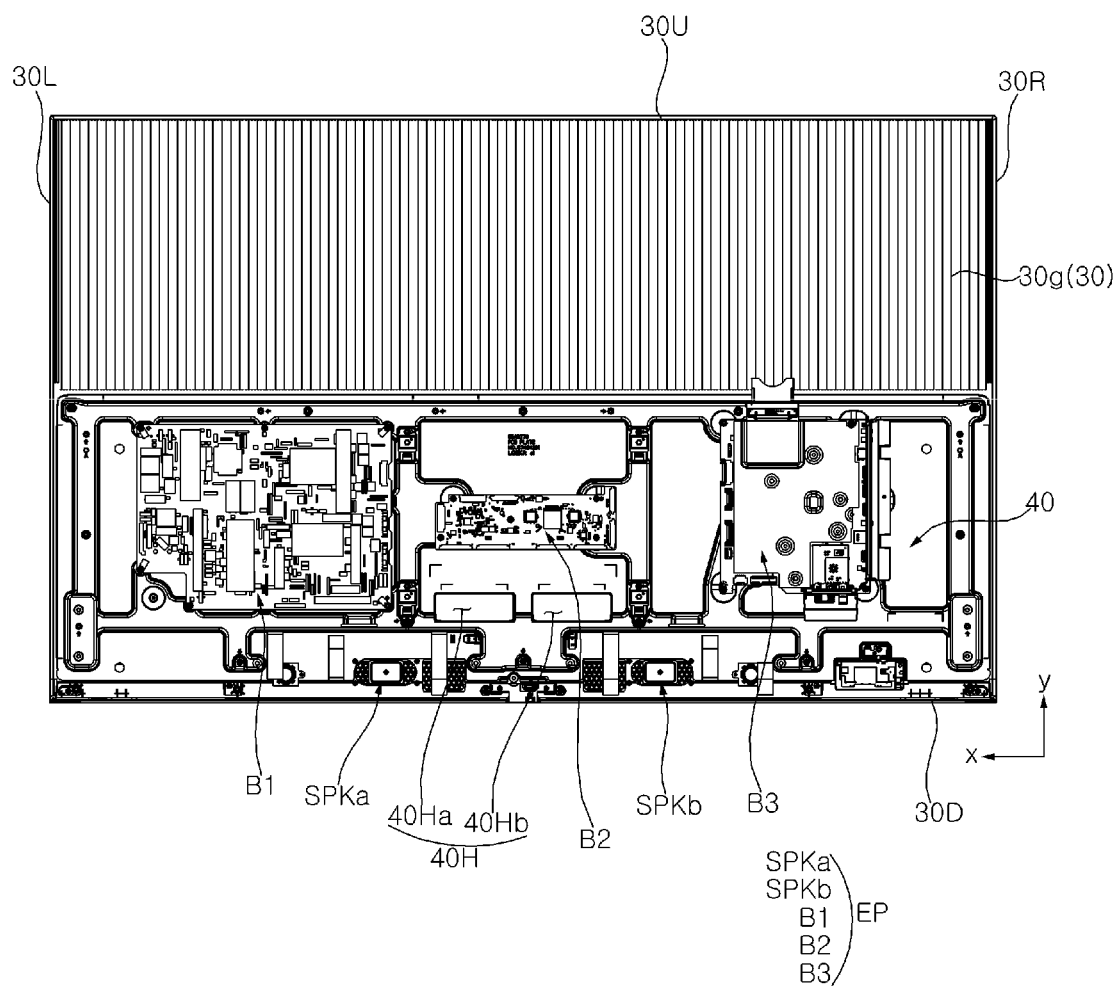

Referring to FIG. 12, the mount plate 40 may include a flat plate portion and a pressed portion which is pressed from the flat plate portion, thereby improving rigidity of the mount plate 40.

The electronic parts EP may be disposed at the rear of the mount plate 40 and may be mounted on the mount plate 40. The electronic parts EP may include a plurality of boards B1, B2, and B3 and speakers SPKa and SPKb.

A power supply board B1 may be disposed at the rear of the mount plate 40 and may be coupled to the mount plate 40 by screw coupling and the like. The power supply board B1 may be disposed on the left of a center region of the mount plate 40 (see 40B1 of FIG. 7). The power supply board B1 may provide power to the respective components of the display device.

A timing controller board B2 may be disposed at the rear of the mount plate 40, and may be coupled to the mount plate 40 by screw coupling and the like. The timing controller board B2 may be disposed in the center region of the mount plate 40 (see 40B2 of FIG. 7) and may be disposed above the third cable hole 40H. The timing controller board B2 may be electrically connected to the cables C (see FIG. 11) and may provide a video signal to the display panel 10.

A main board B3 may be disposed at the rear of the mount plate 40, and may be coupled to the mount plate 40 by screw coupling and the like. The main board B3 may be disposed on the right side of the center region of the mount plate 40 (see 40B3 of FIG. 7). The main board B3 may control the display device.

The speakers SPKa and SPKb may be disposed at the rear of the mount plate 40, and may be coupled to the mount plate 40 by screw coupling and the like. The speakers SPKa and SPKb may be adjacent to the bottom side of the mount plate 40. A left speaker SPKa may be aligned with the left speaker holes 40a, 30a, 20a, and 20Ca (see FIGS. 3 and 4), and a right speaker SPKb may be aligned with the right speaker holes 40b, 30b, 20b, and 20Cb (see FIGS. 3 and 4). Accordingly, the speakers SPKa and SPKb may direct sound to the front of the display device through the speaker holes 40a, 30a, 20a, 20Ca, 40b, 30b, 20b, and 20Cb.

Figure 13:
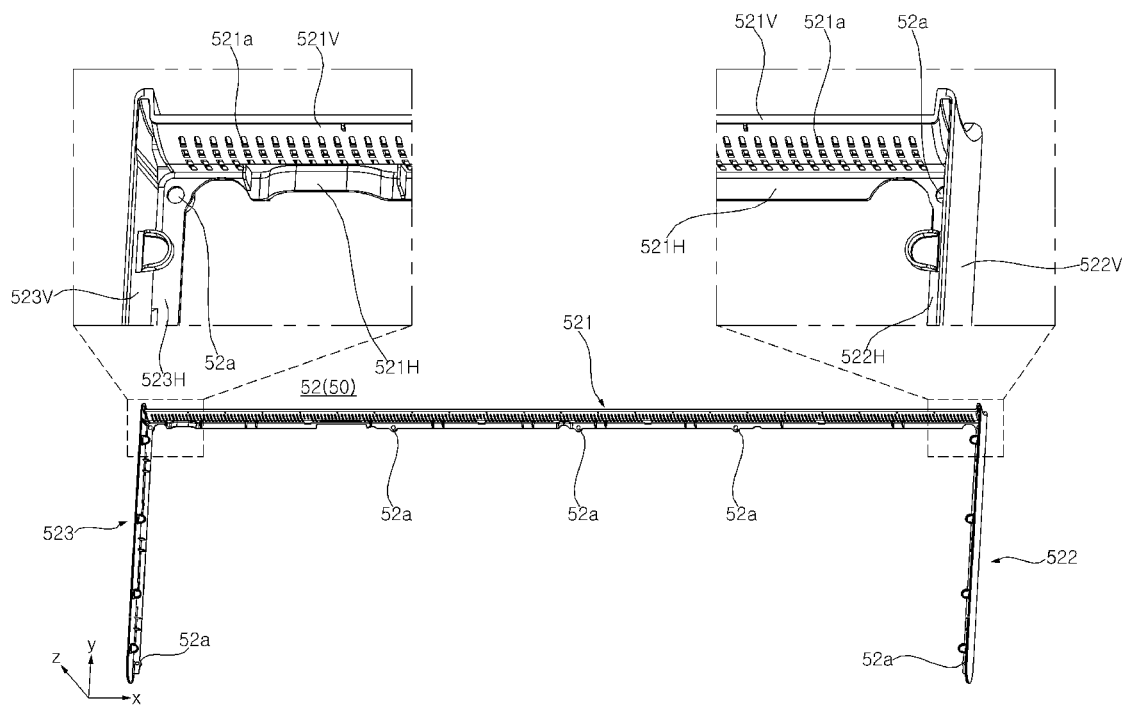

Referring to FIG. 13, a side cover 52 may have a generally square bracket shape. The side cover 52 may include a top part 521, a left part 522, and a right part 523.

The top part 521 may extend horizontally and may form a long side of the side cover 52. A horizontal part 521H may form a rear side of the side cover 52. A vertical part 521B may intersect the horizontal part 521H, and may form an upper side of the side cover 52. A plurality of holes 521a may be formed by vertically passing through a vertical part 521V, and may be horizontally spaced apart from each other. The holes 521a may be referred to as heat-dissipating holes.

The left part 522 may extend downwardly from a left end of the top part 521 and may form a short side of the side cover 52. A horizontal part 522H may form a rear side of the side cover 52. A vertical part 522V may form a left side of the side cover 52.

The right part 523 may extend downwardly from a right end of the top part 521, and may form a short side of the side cover 52. A horizontal part 523H may form a rear side of the side cover 52. A vertical part 523V may form a right side of the side cover 52.

A plurality of coupling holes 52a may be formed in the horizontal parts 521H, 522H, and 523H of the side cover 52, and may be spaced apart from each other along the horizontal parts 521H, 522H, and 523H. For example, the coupling holes 52a of the horizontal part 521H may be disposed in the vicinity of a center portion of the horizontal part 521H. For example, the respective coupling holes 52a of the horizontal part 522H may be adjacent to an upper end and a lower end, respectively, of the left part 522. For example, the respective coupling holes 52a of the horizontal part 523H may be adjacent to an upper end and a lower end, respectively, of the right part 523.

Figure 14:
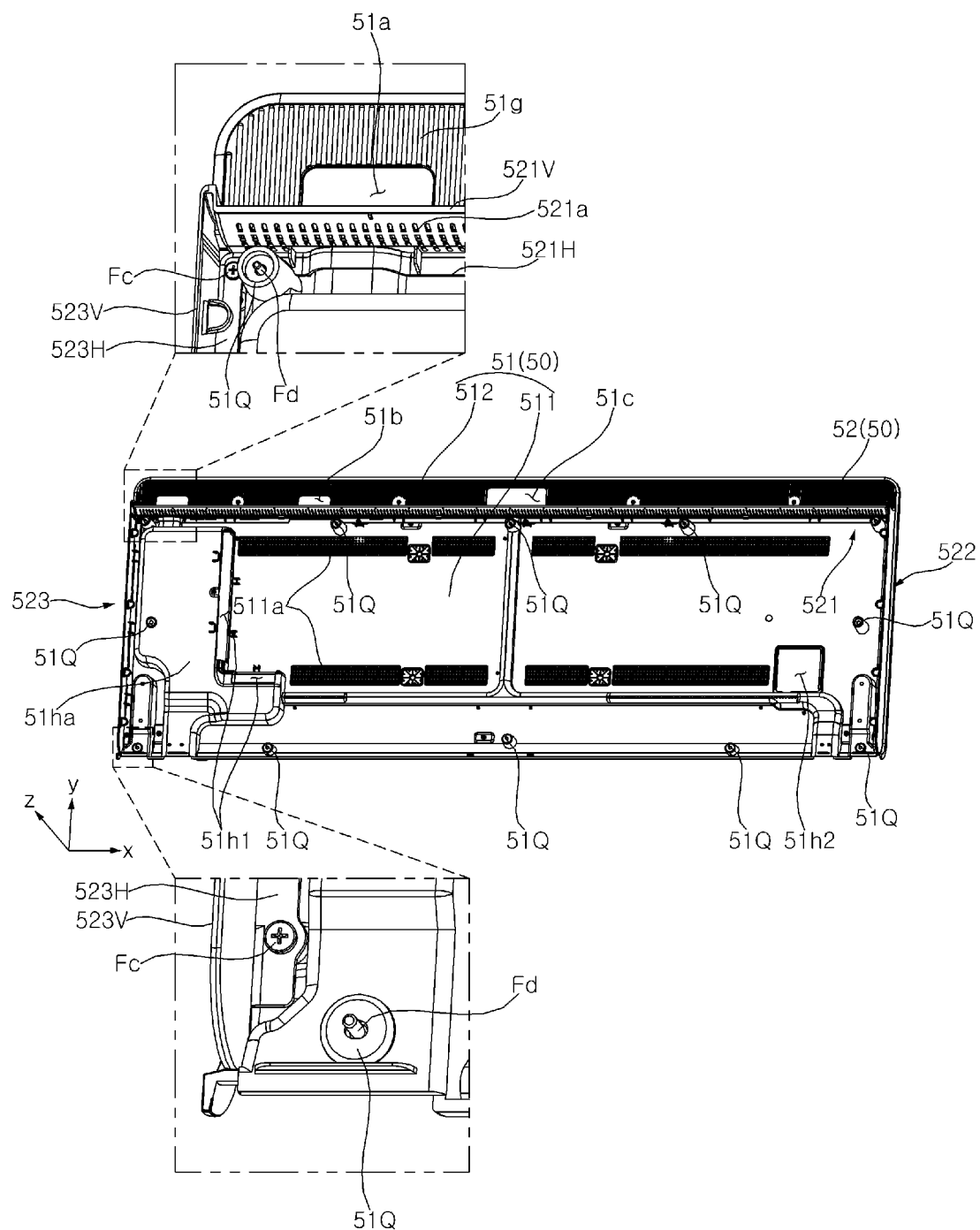
Figure 15:
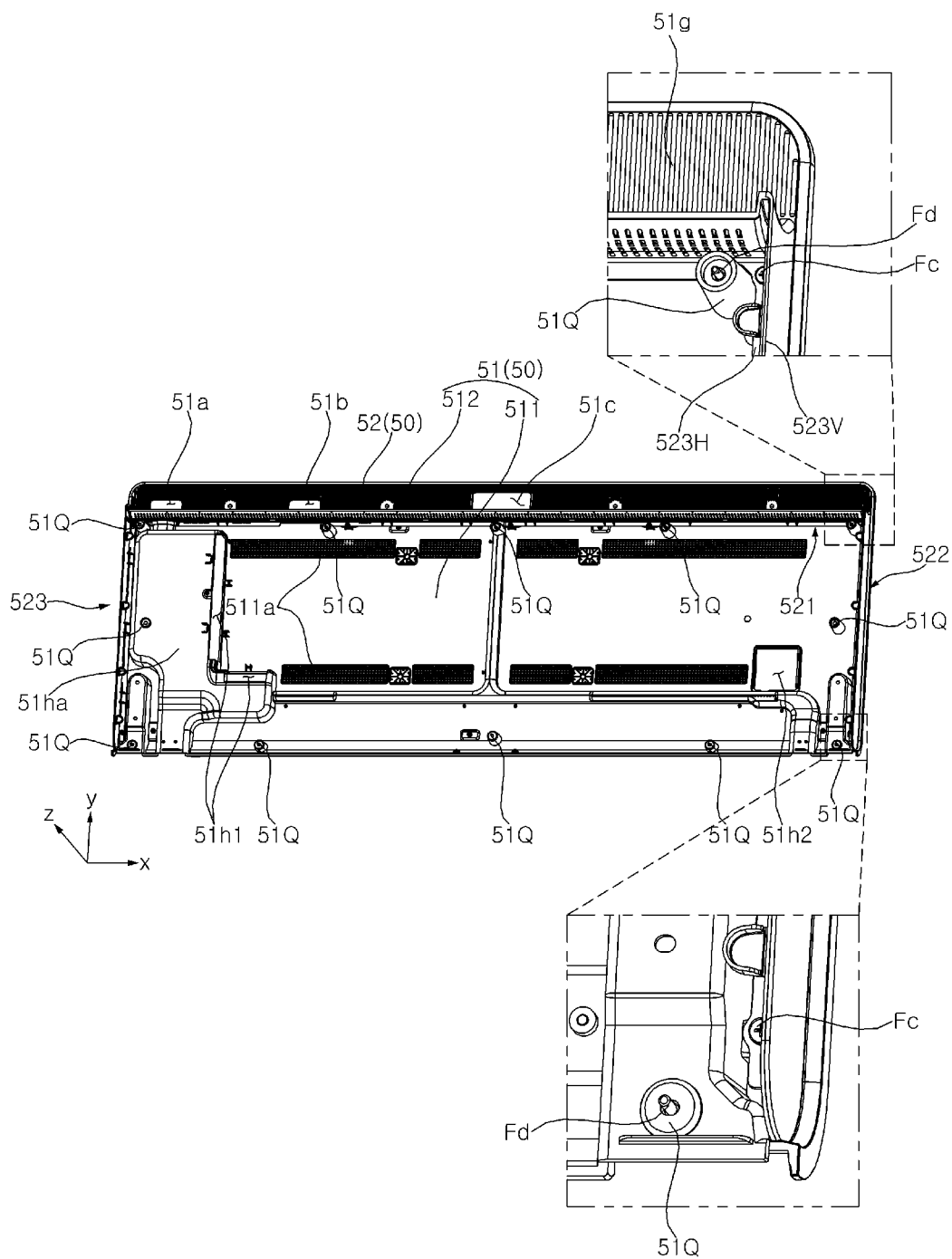
Figure 16:
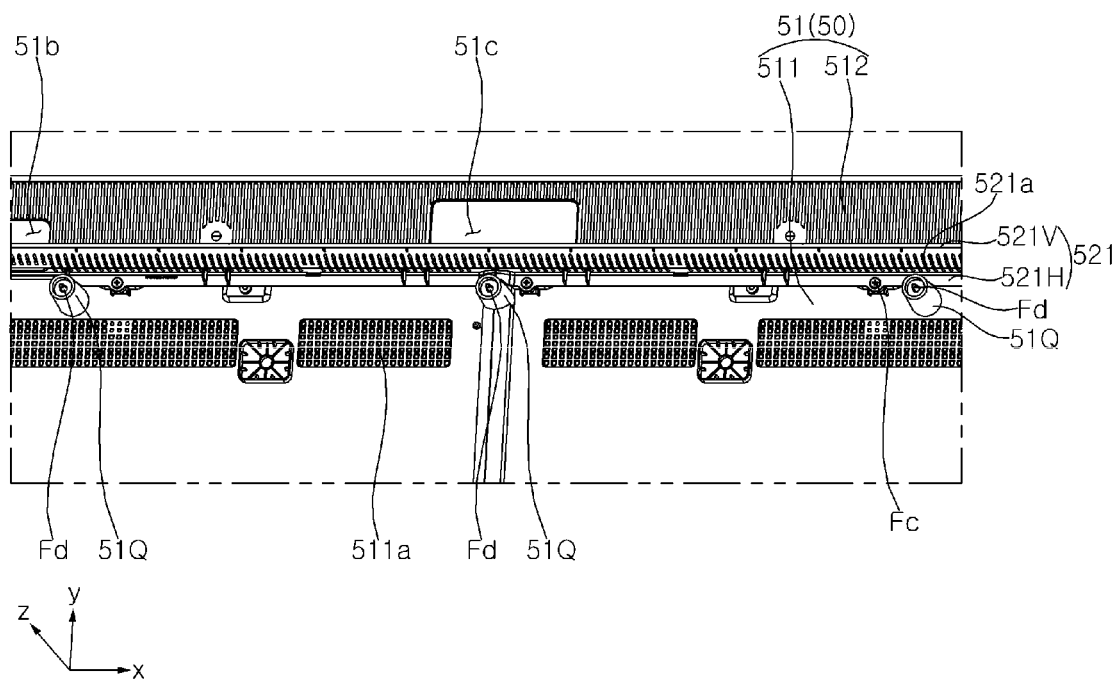

Referring to FIGS. 14 to 16, a rear cover 51 may be disposed at the rear of the side cover 52. The rear cover 51 may be disposed opposite the mount plate 40 (see FIG. 12) with respect to the side cover 52. The rear cover 51 may include an inner part 511 and an outer part 512.

The inner part 511 may be a portion of the rear cover 51 that is disposed on the inside of the side cover 52. A size of the inner part 511 may correspond to a size of the mount plate 40 (see FIG. 12). The inner part 51 may cover a rear side of the mount plate 40 and the electronic parts EP (see FIG. 2). A plurality of holes 511a may be formed by passing through the inner part 511 in the front-rear direction. The holes 511a may be referred to as heat-dissipating holes.

The outer part 512 may be a portion of the rear cover 51 that is disposed on the outside of the side cover 52. The outer part 512 may be disposed opposite the inner part 511 with respect to the top part 521 of the side cover 52. In the up-down direction, a length of the outer part 512 may be smaller than a length of the inner part 511. A pattern 51g may be formed on a front surface of the outer part 512. For example, the pattern 51g may be embossed vertical stripes. For example, the pattern 51g may be the same as or similar to the pattern 30g (see FIG. 5) formed on the rear surface of the second part 30A2 of the frame 30.

Referring to FIG. 14, a fastening member Fc, such as a screw, may be fastened to the rear cover 51 through the coupling holes 52a (see FIG. 13) of the horizontal part 523H of the right part 523. Referring to FIG. 15, the fastening member Fc, such as a screw, may be fastened to the rear cover 51 through the coupling holes 52a (see FIG. 13) of the horizontal part 522H of the left part 522. Referring to FIG. 16, the fastening member Fc, such as a screw, may be fastened to the rear cover 51 through the coupling holes 52a (see FIG. 13) of the horizontal part 521H of the top part 521. Accordingly, the side cover 52 may be coupled to the rear cover 51.

Meanwhile, rear coupling parts 51Q may protrude from the inside of the inner part 511 toward the coupling parts 30Q (see FIGS. 6 and 7) and may have holes communicating with the inside of the coupling parts 30Q. For example, the rear coupling parts 51Q and the rear cover 51 may be integrally formed as one body. Alternatively, the rear coupling parts 51Q may be press-fit into the inner part 511. In the front-rear direction, a plurality of rear coupling parts 51Q may be aligned with the plurality of coupling parts 30Q (see FIGS. 6 and 7). The plurality of rear coupling pats 51Q may be arranged along an inner perimeter of a side cover 51. A fastening member Fd, such as a screw, may be fastened to the coupling parts 30Q by the rear coupling parts 51Q, thereby allowing the rear cover 51 to be coupled to the frame 30. Alternatively, unlike the above example, the coupling parts 30Q may protrude from the plate 20 toward the rear coupling parts 51Q.

Figure 17:
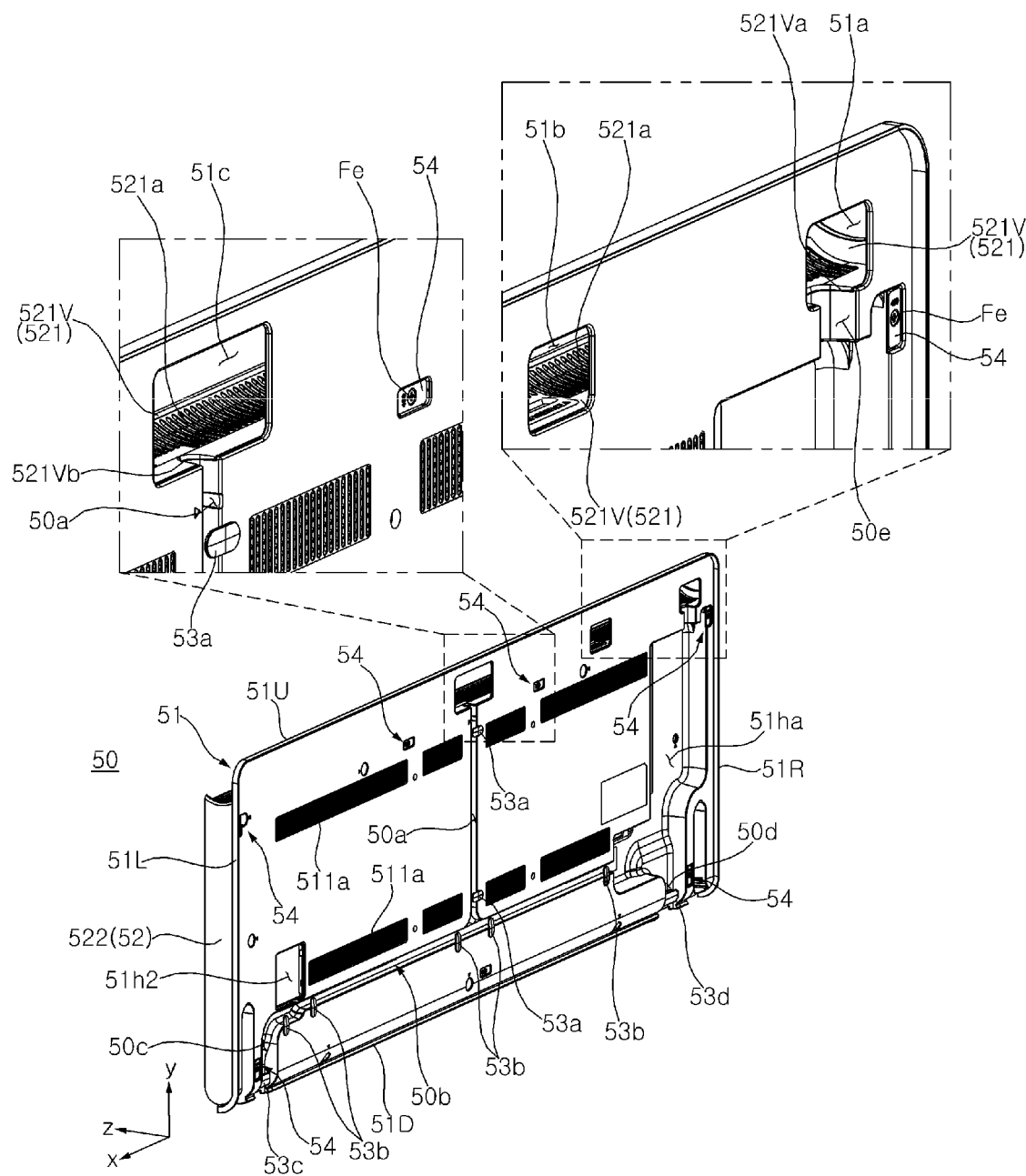

Referring to FIG. 17, slots 51a, 51b, and 51c may be formed by passing through the rear cover 51 in the front-rear direction. For example, the slots 51a, 51b, and 51c may be square openings. The plurality of slots 51a, 51b, and 51c may be spaced apart from each other in the left-right direction. A first slot 51a may be adjacent to the upper side and the right side of the rear cover 51. A second slot 51b may be spaced apart leftward from the first slot 51a. A third slot 51c may be spaced apart leftward from the second slot 51b.

A recessed portion 51ha may be recessed forwardly from a rear surface of the rear cover 51 and may be adjacent to the right side of the rear cover 51. Holes 51h1 (see FIG. 14) may be formed by passing through a lateral side or a lateral wall of the recessed portion 51ha. For example, a user may connect video and/or audio input/output terminals, a USB port, a power input terminal, and the like to input/output units provided in the main board B3 (see FIG. 12) through the holes 51h1.

A cover hole 51h2 may be formed by passing through the rear cover 51. A position of the cover hole 51h2 may correspond to a position of the power supply board B1 (see FIG. 12).

A plurality of grooves 50a, 50b, 50c, 50d, and 50e may be formed in the rear surface of the rear cover 51. The plurality of grooves 50a, 50b, 50c, 50d, and 50e may have an elongated ditch shape. The plurality of cables (not shown) may be disposed in the grooves 50a, 50b, 50c, 50d, and 50e and the recessed portion 51ha.

A first groove 50a may be disposed at the center of the rear cover 51 and may extend vertically. An upper end of the first groove 50a may be connected to a portion of the rear cover 51 that forms a boundary of the third slot 51c. A second cut-out 521Vb may be formed in the vertical part 521V and may be disposed opposite the first groove 50a. The second cut-out 521Vb may communicate with the first groove 50a and may provide a passage for a cable. A first holder 53a may be fixed to the rear surface of the rear cover 51 and may partially cover a rear side of the first groove 50a. The first holder 53a may prevent separation of a cable disposed in the first groove 50a.

A second groove 50b may extend horizontally from a lower end of the first groove 50a. The second groove 50b may be adjacent to the bottom side of the rear cover 51. The second holder 53b may be fixed to the rear surface of the rear cover 51 and may partially cover a rear side of the second groove 50b. The second holder 53b may prevent separation of a cable disposed in the second groove 50b.

A third groove 50c may extend downwardly from a left end of the second groove 50b and may be formed at a portion of the bottom side of the rear cover 51. The third groove 50c may be adjacent to the left side of the rear cover 51. The third holder 53c may be disposed in the third groove 50c, may be fixed to the rear cover 51, and may have a path communicating with the third groove 50c. The third holder 53c may prevent separation of a cable disposed in the third groove 50c.

A fourth groove 50d may extend downwardly from a right end of the second groove 50b and may be formed at a portion of the bottom side of the rear cover 51. The fourth groove 50d may be adjacent to the right side of the rear cover 51. The recessed portion 51ha may be disposed between the second groove 50b and the fourth groove 50d and may connect the second groove 50b and the fourth groove 50d. Here, the recessed portion 51ha may be adjacent to the right side of the rear cover 51 and may have a puddle shape. The fourth holder 53d may be disposed in the fourth groove 50d, may be fixed to the rear cover 51, and may have a path communicating with the fourth groove 50d. The fourth holder 53d may prevent separation of a cable disposed in the fourth groove 50d.

A fifth groove 50e may extend from an upper end of the recessed portion 51ha toward the first slot 51a. An upper end of the fifth groove 50e may be connected to a portion of the rear cover 51 that forms a boundary of the first slot 51a. A first cut-out 521Va may be formed in the vertical part 521V and may be disposed opposite the fifth groove 50e. The first cut-out 521Va may communicate with the fifth groove 50e and may provide a passage for a cable.

A magnetic substance 54, such as iron (Fe), may be coupled to the rear surface of the rear cover 51 by, for example, a coupling member Fe such as a screw. A plurality of magnetic substances 54 may be arranged along the perimeter of the rear cover 51.

Figure 18:
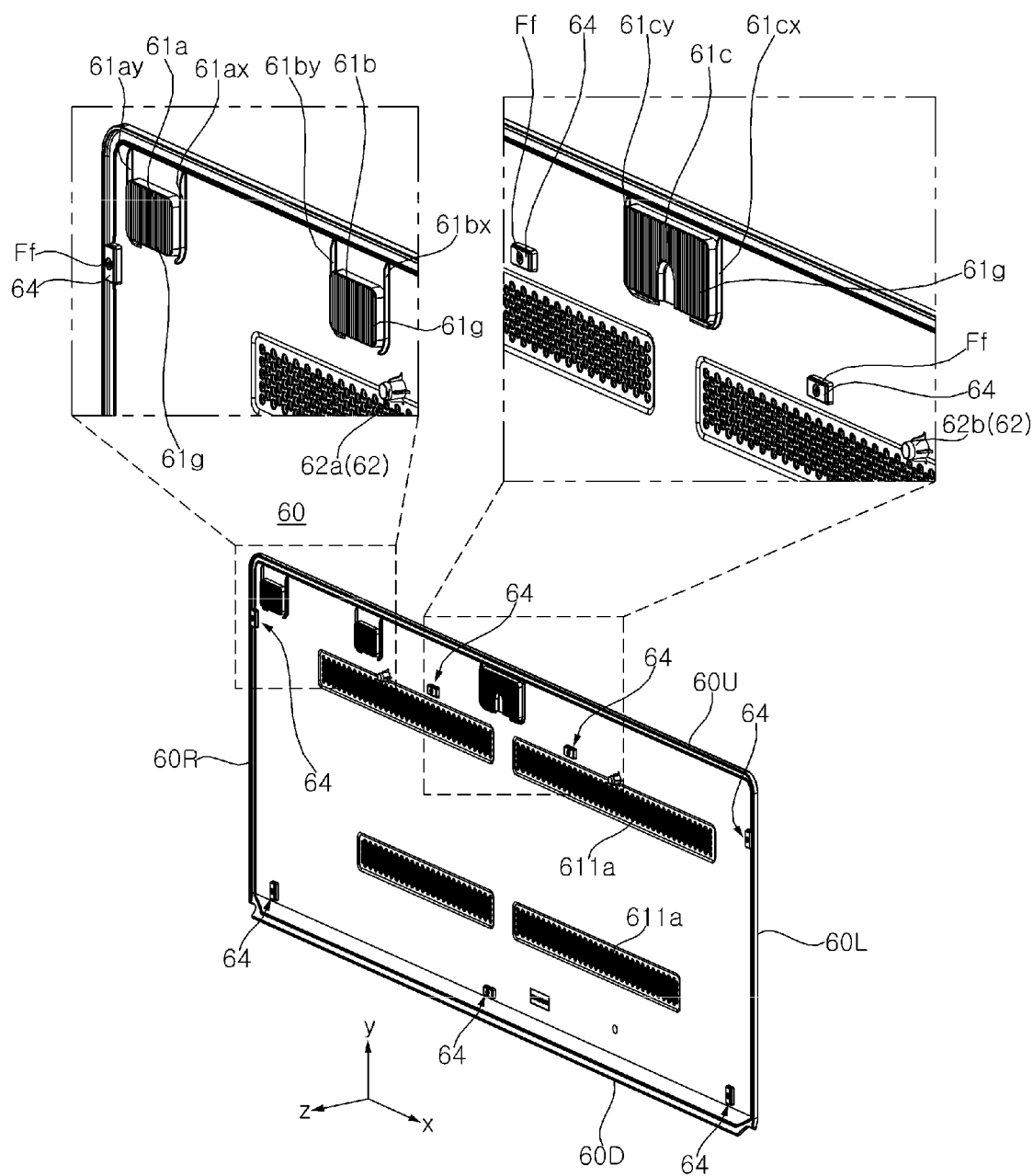
Figure 19:
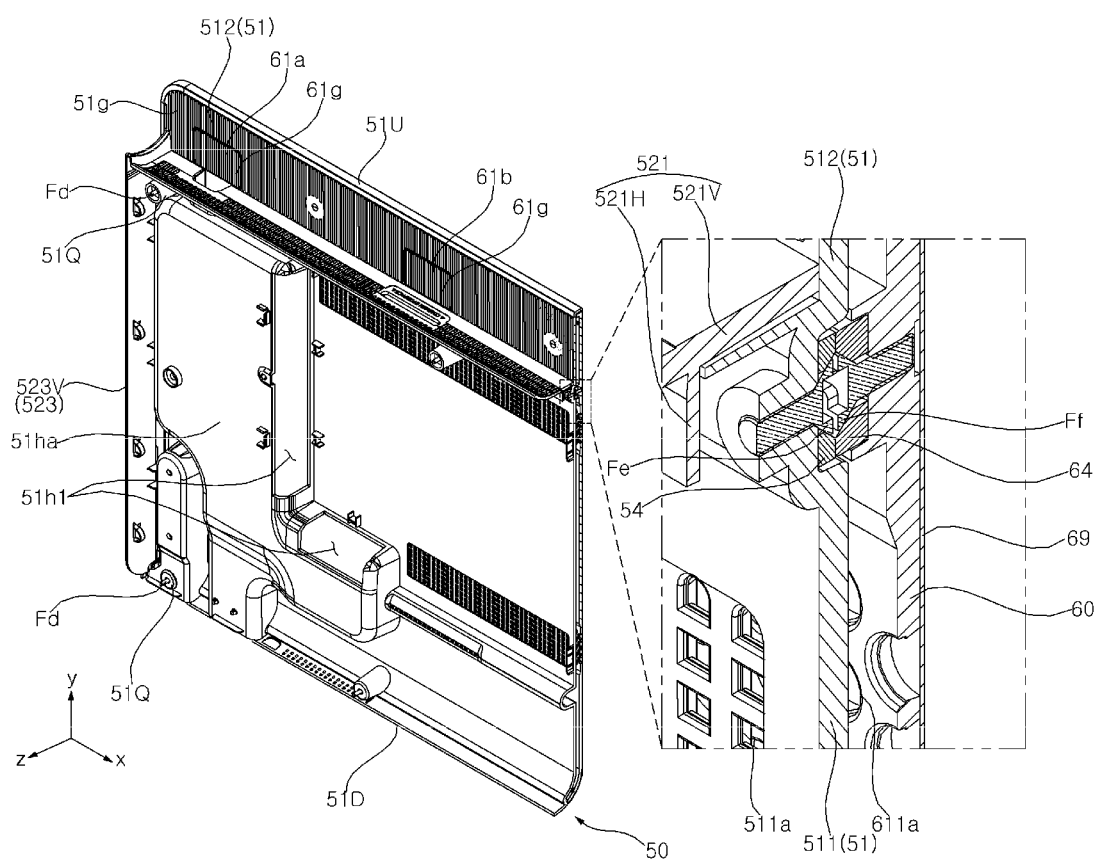

Referring to FIGS. 18 and 19, the end cover 60 may be disposed at the rear of the back cover 50. A size of the end cover 60 may correspond to a size of the rear cover 51 of the back cover 50. A plurality of holes 611a may pass through the end cover 60 in the front-rear direction. The holes 611a may face the holes 511a and may be referred to as heat-dissipating holes.

Blocks 61a, 61b, and 61c may protrude from a front surface of the end cover 60 toward the slots 51a, 51b, and 51c (see FIG. 17). The blocks 61a, 61b, and 61c may have sizes corresponding to the slots 51a, 51b, and 51c. A first block 61a may be inserted into the first slot 51a and may have a pattern 61g which is the same as or similar to the pattern 51g. A second block 61b may be inserted into the second slot 51b and may have the pattern 61g which is the same as or similar to the pattern 51g. A third block 61c may be inserted into the third slot 51c and may have the pattern 61g which is the same as or similar to the pattern 51g.

A magnet 64 may be coupled to the front surface of the end cover 60 by, for example, a fastening member Ff such as a screw. A plurality of magnets 64 may be arranged along the perimeter of the end cover 60. In the front-rear direction, the plurality of magnets 64 may be aligned with the plurality of magnetic substances 54. Accordingly, the end cover 60 may be coupled to the rear cover 51 by magnetic coupling between the magnets 64 and the magnetic substances 54. In some embodiments, the magnetic substances may be provided in the end cover 60 and the magnets may be provided in the rear cover 51, or a pair of magnets with a magnetic attractive force acting therebetween may be provided for the rear cover 51 and the end cover 60, respectively.

Figure 20:
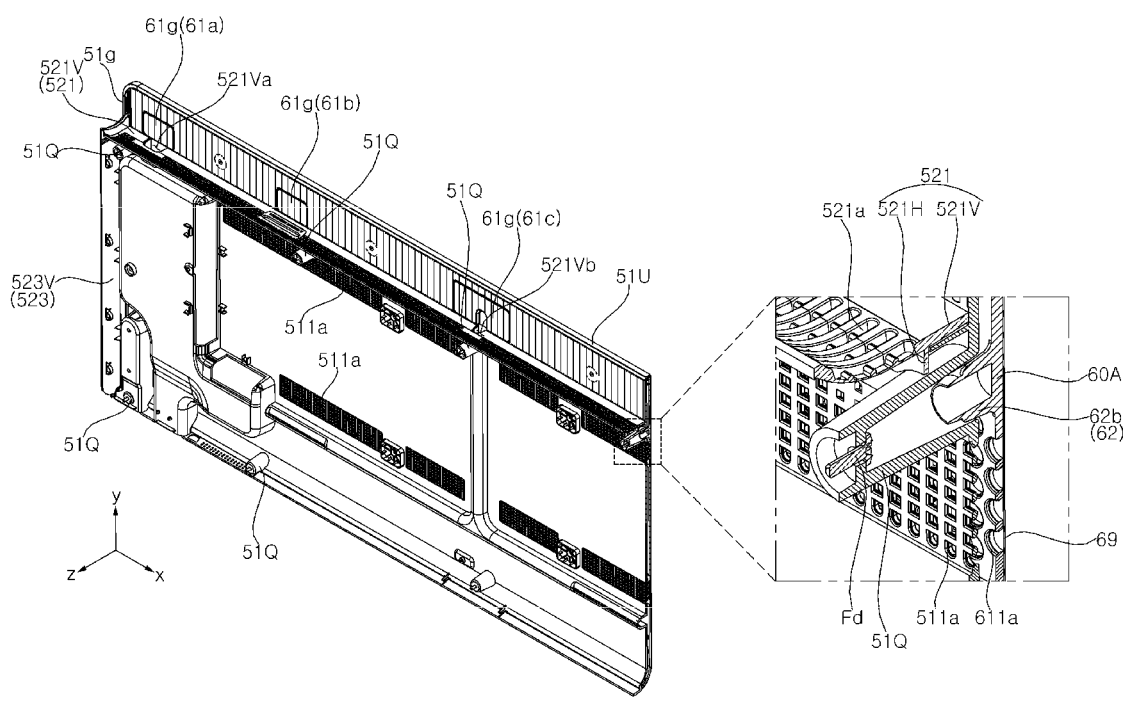

Referring to FIGS. 18 and 20, a guide protrusion 62 may protrude forward from the front surface of the end cover 60. For example, a plurality of guide protrusions 62a and 62 may be provided on the front surface of the end cover 60 and may be spaced apart from each other.

In the front-rear direction, the guide protrusions 62 may be aligned with the rear coupling parts 51Q of the rear cover 51. The guide protrusions 62 may be inserted into the rear coupling parts 51Q. Accordingly, the rear coupling parts 51Q may restrict an up-down and left-right movement, i.e., a horizontal movement, of the guide protrusions 62 and the end cover 60. In addition, the guide protrusions 62 may guide coupling between the end cover 60 and the rear cover 51.

Figure 21:
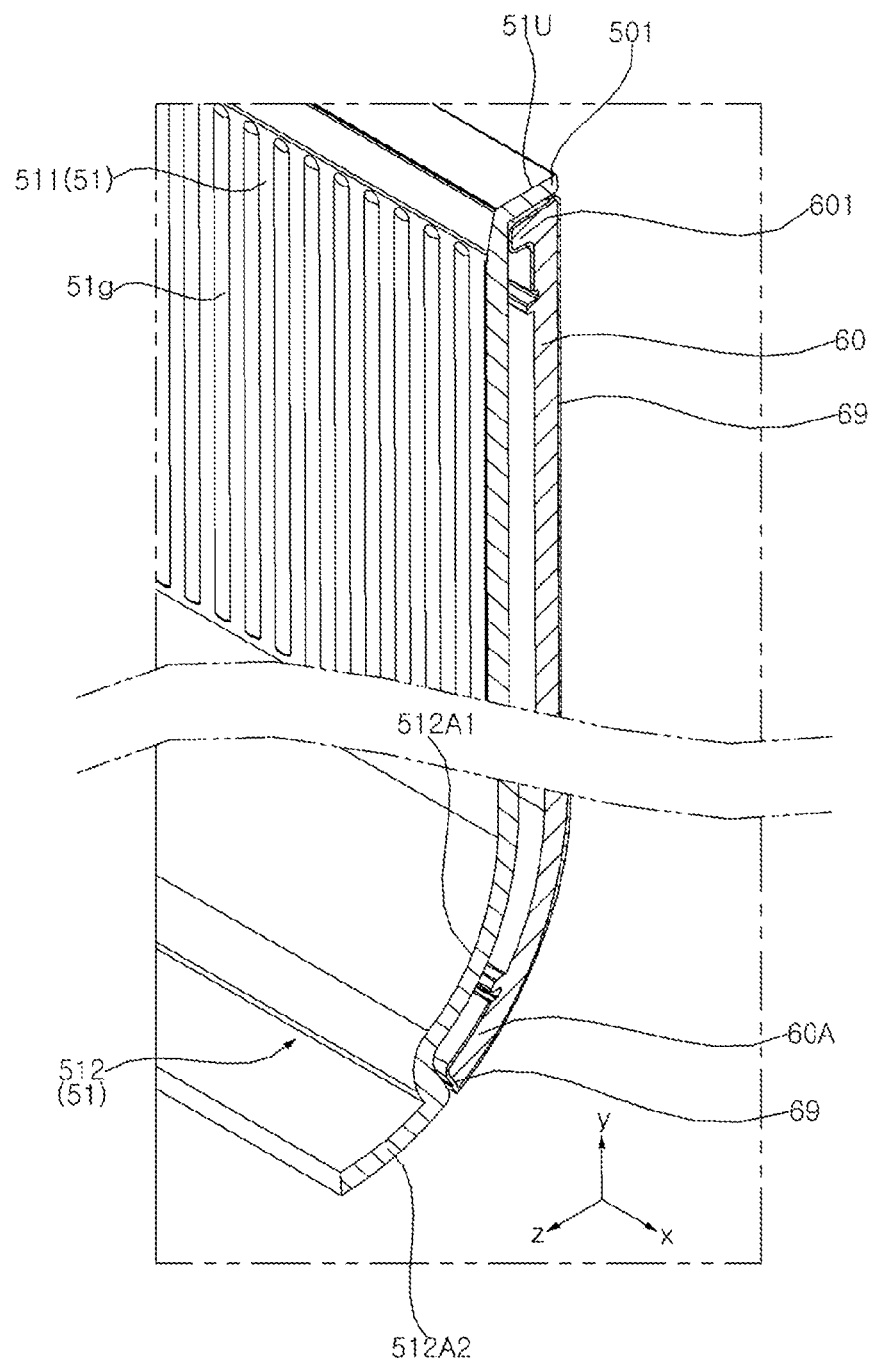

Referring to FIG. 21, a bending portion 501 of the rear cover 51 may be bent rearwardly from the perimeter of the rear cover 51, and may form an upper side 51U, a left side 51L (see FIG. 17), and a right side 51R (see FIG. 17). Curved portions 512A1 and 512A2 may form a lower side of the rear cover 51, and may be curved. A second curved portion 512A2 may be stepped with respect to a first curved portion 512A1, and may form a bottom side 51D of the rear cover 51.

A bending portion 601 of the end cover 60 may be bent forwardly from the perimeter of the end cover 60, and may form an upper side 60U (see FIG. 18), a left side 60L (see FIG. 18), and a right side 60R (see FIG. 18). A curved portion 60A may form a lower side of the end cover 60, and may be curved.

A jersey 69 may cover the rear side of the end cover 60. Alternatively, the jersey 69, provided as a component of the end cover 60, may form a rear surface of the end cover 60. The jersey 69 may cover edges of the end cover 60, and may be attached or fused to the front surface of the end cover 60. The jersey 69 may include a fabric material.

Figure 22:
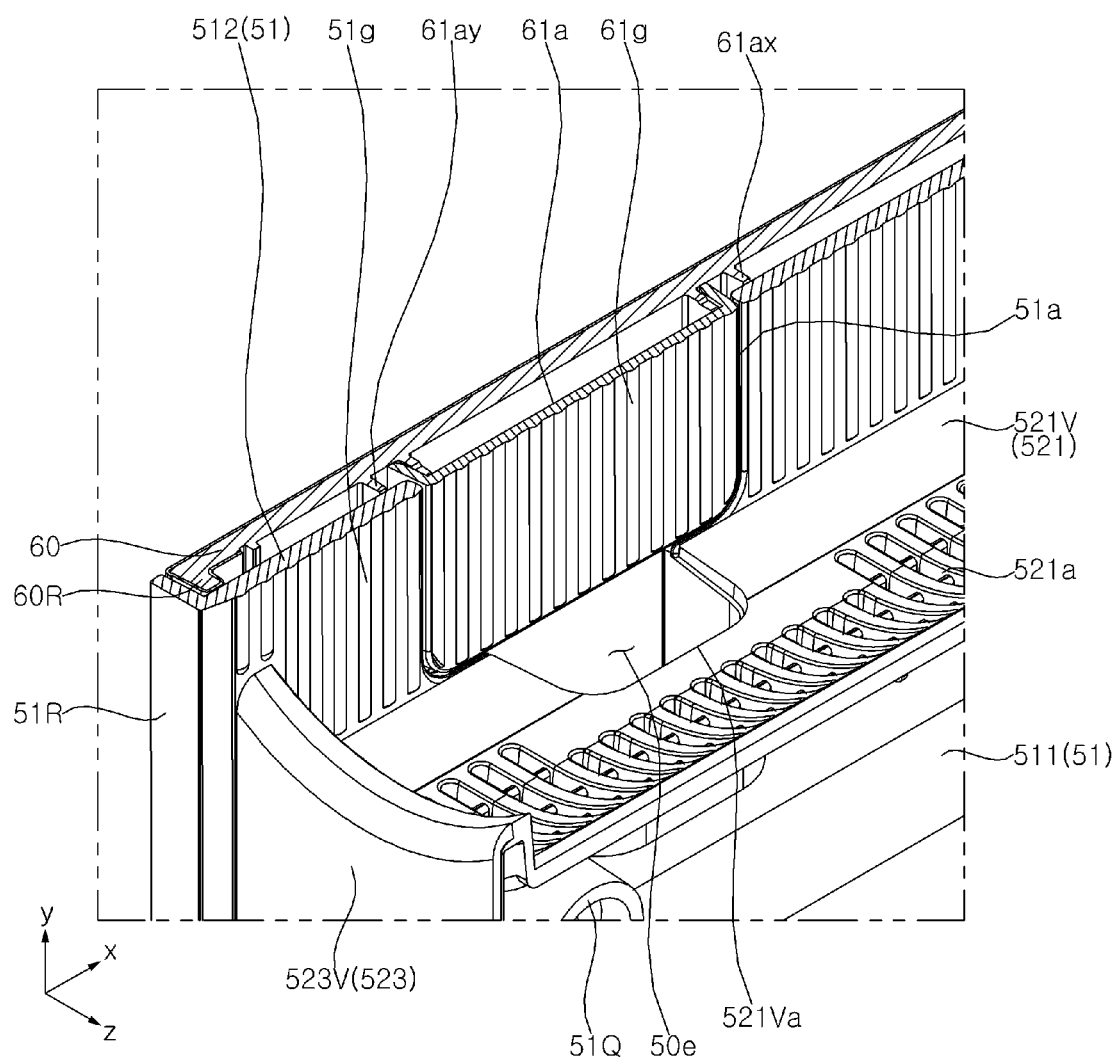

Referring to FIG. 22, first support ribs 61ax and 61ay may protrude from the front surface of the end cover 60 toward the rear surface of the outer part 512 of the rear cover 51. The first support ribs 61ax and 61ay may be disposed around the first block 61a. The first support ribs 61ax and 61ay may be a pair of vertical ribs disposed opposite each other with respect to the first block 61a.

Figure 23:
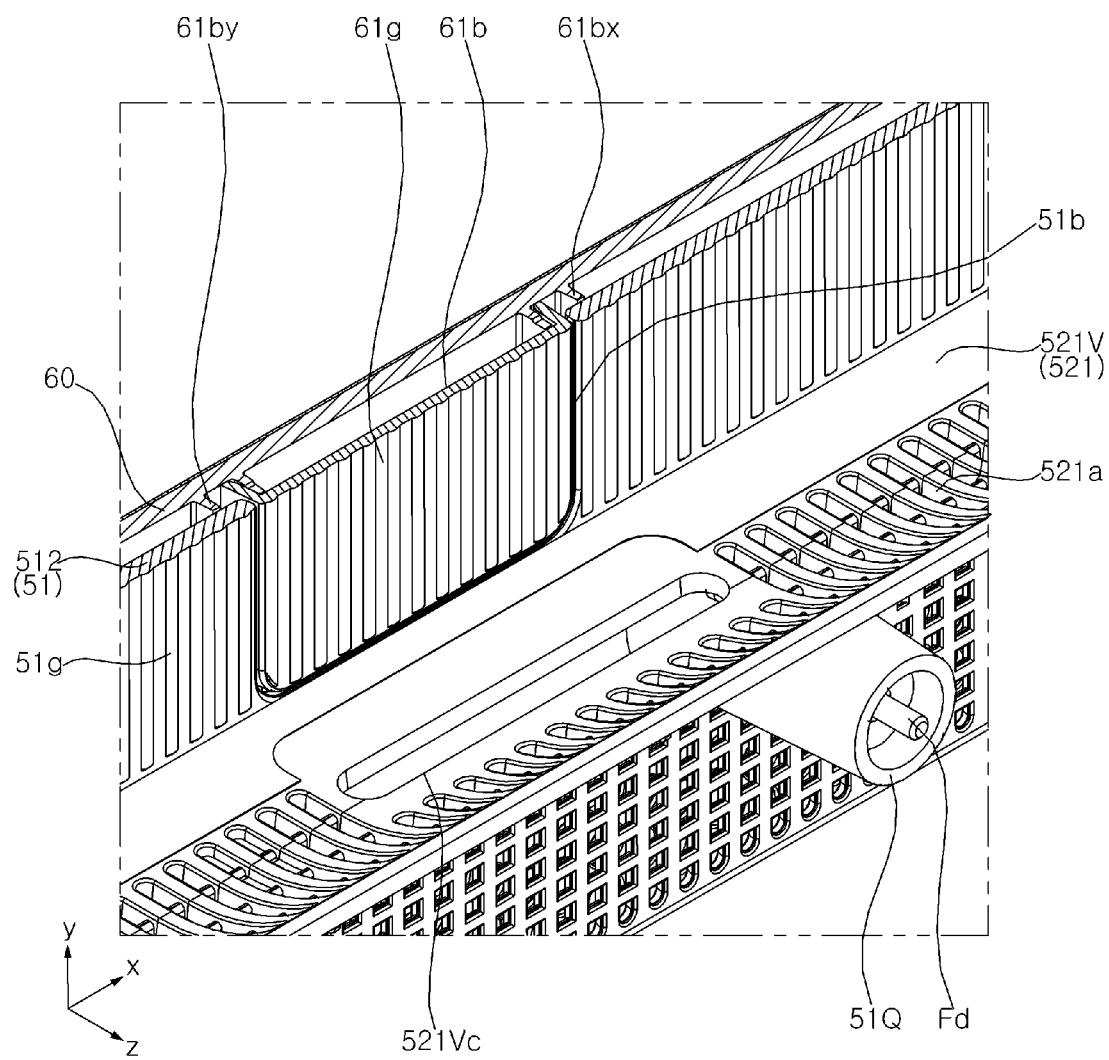

Referring to FIG. 23, second support ribs 61bx and 61by may protrude from the front surface of the end cover 60 toward the rear surface of the outer part 512 of the rear cover 51. The second support ribs 61bx and 61by may be disposed around the second block 61b. The second support ribs 61bx and 61by may be a pair of vertical ribs disposed opposite each other with respect to the second block 61b.

Figure 24:
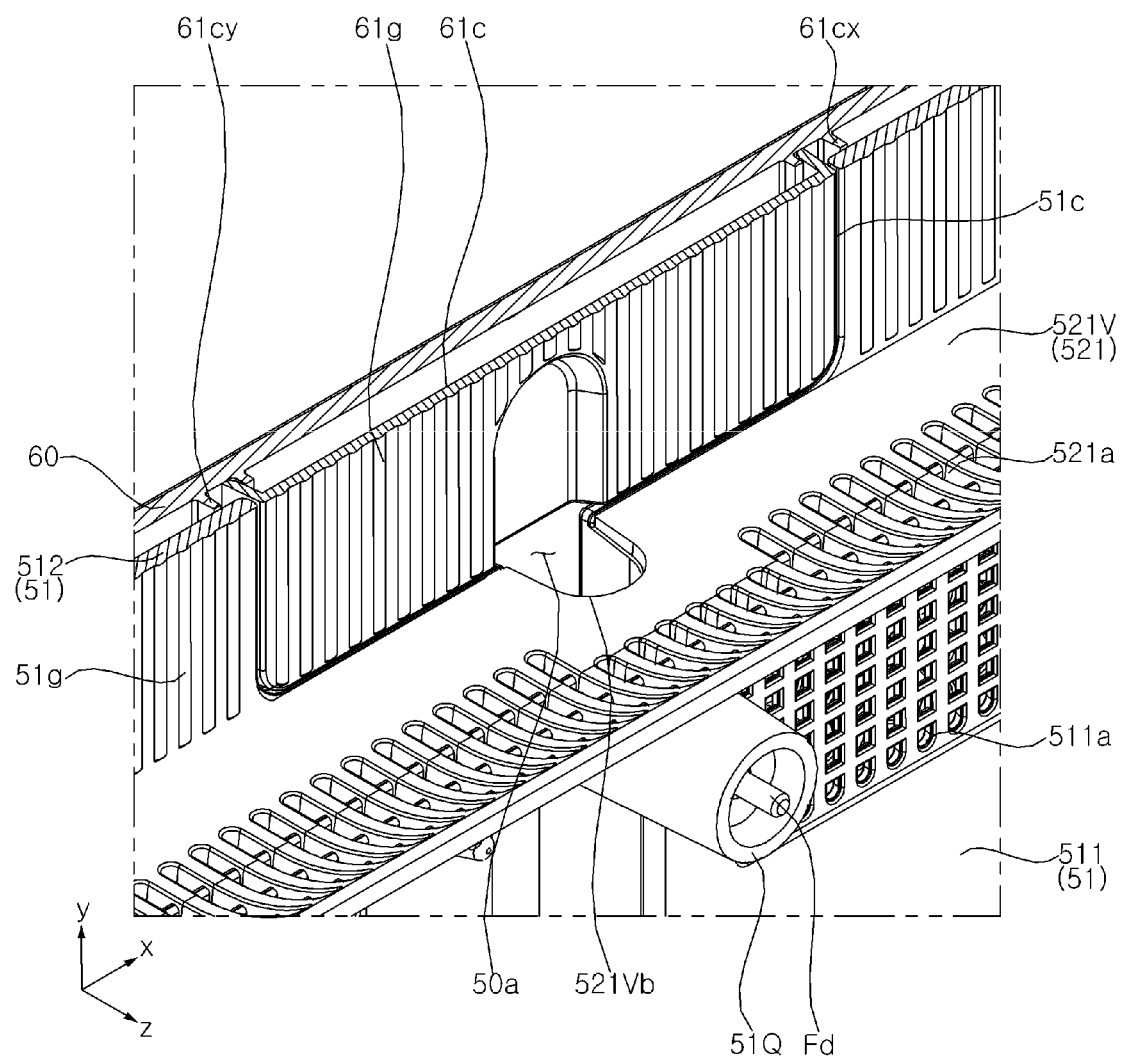

Referring to FIG. 24, third support ribs 61cx and 61cy may protrude from the front surface of the end cover 60 toward the rear surface of the outer part 512 of the rear cover 51. The third support ribs 61cx and 61cy may be disposed around the third block 61c. The third support ribs 61cx and 61cy may be a pair of vertical ribs disposed opposite each other with respect to the third block 61c.

The support ribs 61ax, 61ay, 61bx, 61by, 61cx, and 61cy may support the rear surface of the outer part 512. Accordingly, the support ribs 61ax, 61ay, 61bx, 61by, 61cx, and 61cy may minimize sagging of the outer part 512.

Figure 25:
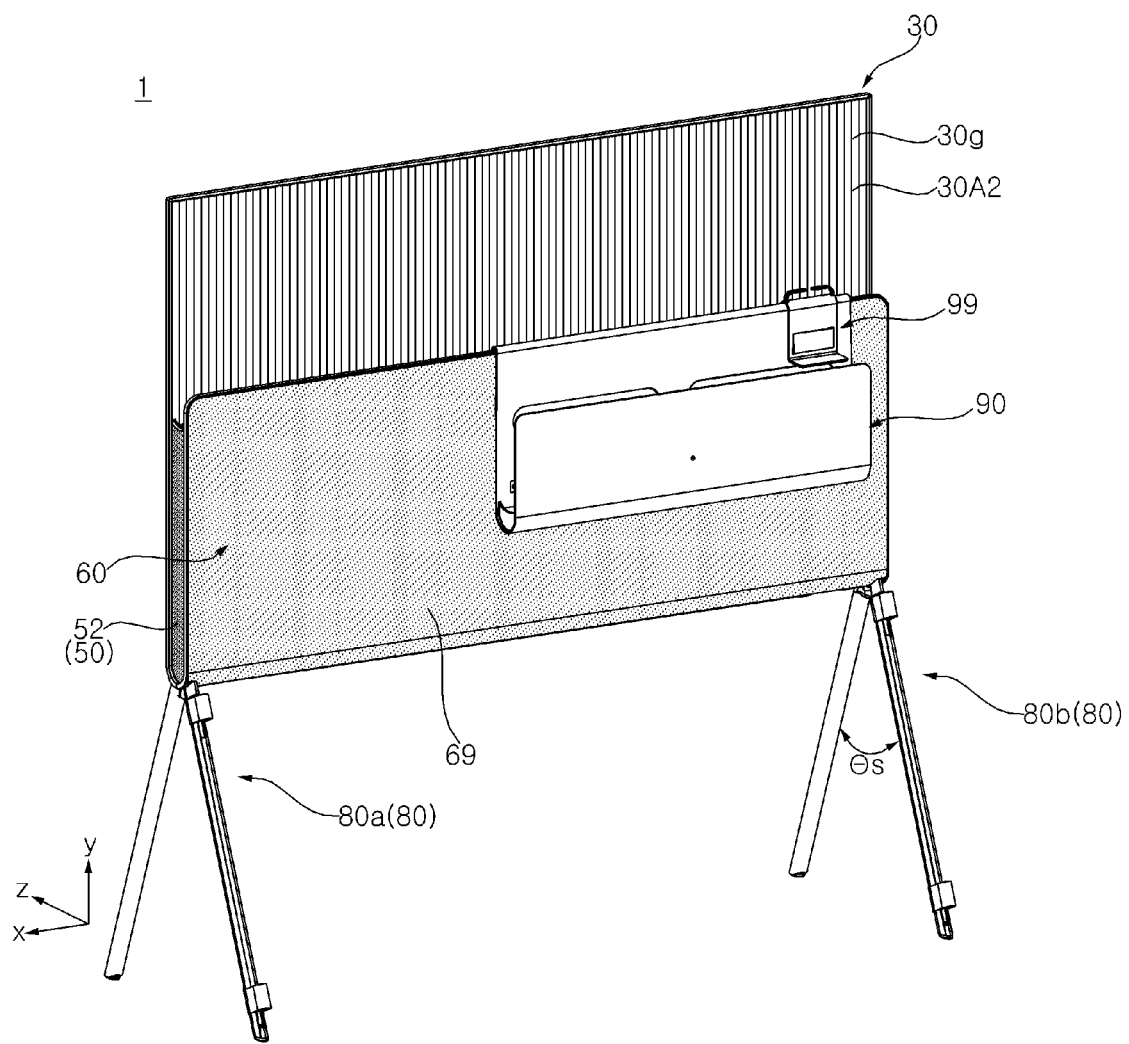
Figure 26:
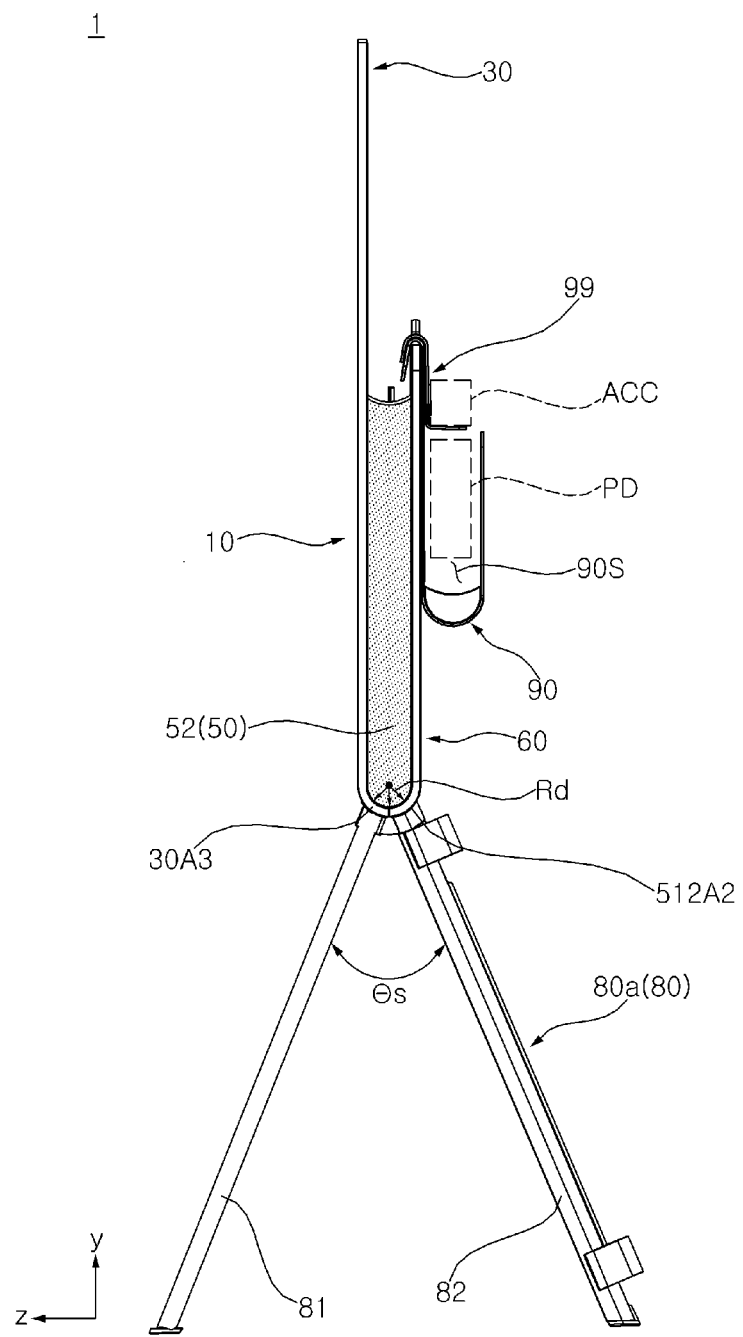

Referring to FIGS. 25 and 26, a rear side of the second part 30A2 of the frame 30 may not be covered by the back cover 50. The pattern 30g of the second part 30A2 may be exposed to the rear side thereof. The thinnest part of the display device 1 may be defined by a position of the second part 30A2. For example, the thinnest part may have a thickness of 9.3 mm.

The pattern 51g (see FIG. 20) of the back cover 50 and the pattern 61g (see FIG. 20) of the blocks 61a, 61b, and 61c may be exposed between the second part 30A2 of the frame 30 and the outer part 512 of the back cover 50.

The jersey 69 and the side cover 52 may have the same color or different colors. In addition, the front cover 20C (see FIG. 1) and the side cover 52 may have the same color or different colors.

The curved portion 20C2 (see FIG. 9) and the second curved portion 512A2 (see FIG. 21) may have a predetermined curvature Rd.

A stand 80 may be disposed between the back cover 50 and the end cover 60 and may be coupled to the back cover 50 (see FIG. 2). The stand 80 may include a first leg 81 and a second leg 82 which extend in different directions from the lower end of the back cover 50. An angle theta s between the first leg 81 and the second leg 82 may be an acute angle. An upper end of the first leg 81 may support the curved portion 20C2, and an upper end of the second leg 82 may support the second curved portion 512A2. For example, the stand 80 may include a first stand 80a and a second stand 80b which are spaced apart from each other in the left-right direction. Accordingly, the display panel 10 may be upwardly spaced apart from the ground.

A basket 90 may have a generally "U" shape. The basket 90 may be hung on the upper side of the end cover 60. A bracket 99 may have a generally "L" shape. The bracket 99 may be hung on the upper side of the basket 90. For example, a user may fix a power strip or a power bar on the bracket 99 (see ACC of FIG. 26). For example, the user may put a peripheral device PD such as a set-top box or a router, or an object such as a book, in the inner space of the basket 90. Accordingly, objects may be placed in the rear of the display device.

Referring to FIGS. 1 to 26, a display device according to an aspect of the present disclosure may include: a display panel; a plate disposed at a rear of the display panel, and coupled to the display panel; a frame disposed at a rear of the plate; and a mount plate disposed at a rear of the frame, wherein the plate may include a fixing part protruding rearward from a rear surface of the plate, passing through the frame, and coupled to the mount plate.

The plate and the mount plate may include a metal material, and the frame may include a plastic material.

The mount plate may include a hole which is aligned with the fixing part, and through which a fastening member fastened to the fixing part passes.

The frame may further include a pin protruding forward from a front surface of the frame and passing through the plate, wherein the pin may include: a plurality of first pins disposed adjacent to a first side of the frame; and a plurality of second pins disposed adjacent to a second side of the frame.

The frame may include: a first long side; a second long side opposite to the first long side; a first short side connected to the first long side and the second long side; and a second short side opposite to the first short side, wherein: the plurality of first pins may be adjacent to the first short side and spaced apart from each other along the first short side; and the plurality of second pins may be adjacent to the second short side and spaced apart from each other along the second short side.

The display device may further include a plurality of adhesive members disposed between the plate and the frame, and coupled to the plate and the frame, wherein the frame may further include a plurality of ribs protruding from the front surface of the frame toward the rear surface of the plate, and spaced apart from the plurality of adhesive members.

The display device may further include a plurality of adhesive members disposed between the display panel and the plate, and coupled to the display panel and the plate, wherein the plate may include: a flat plate portion; and a pressed portion disposed at a perimeter of the flat plate portion, and pressed rearward from a front surface of the flat plate portion, wherein the plurality of adhesive members may be coupled to a front surface of the pressed portion.

The display device may further include a back cover covering a rear side of the mount plate, wherein the frame may include a coupling part protruding rearward from a rear surface of the frame, passing through the mount plate, and coupled to the back cover.

The fixing part may include a plurality of fixing parts arranged along a perimeter of the mount plate, wherein the coupling part may include a plurality of coupling parts arranged along the perimeter of the mount plate, and spaced apart from the plurality of fixing parts.

The back cover may include a rear coupling part which is aligned with the coupling part, and through which a fastening member fastened to the coupling part passes.

The display device may further include an end cover covering a rear side of the back cover, and coupled to the back cover, wherein the end cover may include a guide protrusion protruding from a front surface of the end cover toward the rear coupling part, and inserted into the rear coupling part.

The display device may further include: a back cover covering the rear side of the mount plate, and coupled to the mount plate; and an end cover covering the rear side of the back cover, wherein the display device may further include a magnetic substance provided for any one of a rear surface of the back cover and the front surface of the end cover, and a magnet provided for the other one.

The display device may further include: a back cover covering the rear side of the mount plate, and coupled to the mount plate; and an end cover covering the rear side of the back cover, and coupled to the back cover, wherein: the back cover may include a slot formed by passing through the back cover in a thickness direction of the back cover; and the end cover may include: a block protruding from the front surface of the end cover toward the slot and inserted into the slot; and a support rib protruding from the front surface of the end cover toward the rear surface of the back cover and positioned around the blocks.

The back cover may further include: a groove formed at the rear surface of the back cover; and a holder fixed to the rear surface of the back cover, and partially covering a rear side of the groove.

A size of the mount plate may be smaller than a size of the frame, wherein the frame may include a first part covered by the mount plate, and a second part not covered by the mount plate, wherein the back cover and the end cover may be disposed opposite the first part with respect to the mount plate.

The effect of the display device according to the present disclosure will be described as follows.

According to at least one of the embodiments of the present disclosure, it is possible to provide a display device including a plate and a mount plate which are coupled to each other with a frame interposed therebetween.

According to at least one of the embodiments of the present disclosure, it is possible to provide a display device in which a portion of a frame as an injection molded product may partially form a rear surface of the display device.

According to at least one of the embodiments of the present disclosure, it is possible to provide a display device providing a structure capable of minimizing sagging of a plate coupled to a frame.

According to at least one of the embodiments of the present disclosure, it is possible to provide a display device having an end cover and a back cover for covering a rear side of a mount plate.

Certain embodiments or other embodiments of the invention described above are not mutually exclusive or distinct from each other. Any or all elements of the embodiments of the invention described above may be combined or combined with each other in configuration or function.

For example, a configuration "A" described in one embodiment of the invention and the drawings and a configuration "B" described in another embodiment of the invention and the drawings may be combined with each other. Namely, although the combination between the configurations is not directly described, the combination is possible except in the case where it is described that the combination is impossible.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
a display panel;
a plate disposed at a rear of the display panel, and coupled to the display panel;
a frame disposed at a rear of the plate; and
a mount plate disposed at a rear of the frame,
wherein the plate comprises a fixing part protruding rearward from a rear surface of the plate, passing through the frame, and coupled to the mount plate, and
wherein the frame comprises a pin protruding forward from a front surface of the frame and passing through the plate.

2. The display device of claim 1, wherein the plate and the mount plate comprise a metal material, and the frame comprises a plastic material.

3. A display device comprising:
a display panel;
a plate disposed at a rear of the display panel, and coupled to the display panel;
a frame disposed at a rear of the plate; and
a mount plate disposed at a rear of the frame,
wherein the plate comprises a fixing part protruding rearward from a rear surface of the plate, passing through the frame, and coupled to the mount plate, and
wherein the mount plate comprises a hole which is aligned with the fixing part, and through which a fastening member fastened to the fixing part passes.

4. The display device of claim 1,
wherein the pin comprises:
a plurality of first pins disposed adjacent to a first side of the frame; and
a plurality of second pins disposed adjacent to a second side of the frame.

5. The display device of claim 4, wherein the frame comprises:
a first long side;
a second long side opposite to the first long side;

a first short side connected to the first long side and the second long side; and a second short side opposite to the first short side, wherein:

the plurality of first pins are adjacent to the first short side and spaced apart from each other along the first short side; and the plurality of second pins are adjacent to the second short side and spaced apart from each other along the second short side.

6. The display device of claim 1, further comprising a plurality of adhesive members disposed between the plate and the frame, and coupled to the plate and the frame, wherein the frame further comprises a plurality of ribs protruding from the front surface of the frame toward the rear surface of the plate, and spaced apart from the plurality of adhesive members.

7. The display device of claim 1, further comprising a plurality of adhesive members disposed between the display panel and the plate, and coupled to the display panel and the plate, wherein the plate comprises:

a flat plate portion; and a pressed portion disposed at a perimeter of the flat plate portion, and pressed rearward from a front surface of the flat plate portion, wherein the plurality of adhesive members are coupled to a front surface of the pressed portion.

8. A display device comprising:

a display panel;

a plate disposed at a rear of the display panel, and coupled to the display panel;

a frame disposed at a rear of the plate;

a mount plate disposed at a rear of the frame; and a back cover covering a rear side of the mount plate, wherein the plate comprises a fixing part protruding rearward from a rear surface of the plate, passing through the frame, and coupled to the mount plate, and wherein the frame comprises a coupling part protruding rearward from a rear surface of the frame, passing through the mount plate, and coupled to the back cover.

9. The display device of claim 8, wherein the fixing part comprises a plurality of fixing parts arranged along a perimeter of the mount plate, wherein the coupling part comprises a plurality of coupling parts arranged along the perimeter of the mount plate, and spaced apart from the plurality of fixing parts.

10. The display device of claim 8, wherein the back cover comprises a rear coupling part which is aligned with the coupling part, and through which a fastening member fastened to the coupling part passes.

11. The display device of claim 10, further comprising an end cover covering a rear side of the back cover, and coupled to the back cover, wherein the end cover comprises a guide protrusion protruding from a front surface of the end cover toward the rear coupling part, and inserted into the rear coupling part.

12. The display device of claim 1, further comprising:

a back cover covering the rear side of the mount plate, and coupled to the mount plate; and an end cover covering the rear side of the back cover, wherein the display device further comprises a magnetic substance provided for any one of a rear surface of the back cover and the front surface of the end cover, and a magnet provided for the other one.

13. The display device of claim 1, further comprising:

a back cover covering the rear side of the mount plate, and coupled to the mount plate; and an end cover covering the rear side of the back cover, and coupled to the back cover, wherein:

the back cover comprises a slot formed by passing through the back cover in a thickness direction of the back cover; and the end cover comprises:

a block protruding from the front surface of the end cover toward the slot and inserted into the slot; and a support rib protruding from the front surface of the end cover toward the rear surface of the back cover and positioned around the block.

14. The display device of claim 13, wherein the back cover further comprises:

a groove formed at the rear surface of the back cover; and a holder fixed to the rear surface of the back cover, and partially covering a rear side of the groove.

15. The display device of claim 13, wherein a size of the mount plate is smaller than a size of the frame, wherein the frame comprises a first part covered by the mount plate, and a second part not covered by the mount plate, wherein the back cover and the end cover are disposed opposite the first part with respect to the mount plate.

* * * * *